US012780741B2

(12) United States Patent
Gogotsi et al.

(10) Patent No.: US 12,780,741 B2
(45) Date of Patent: Nov. 3, 2026

(54) CERAMIC OXIDE COMPOSITES REINFORCED WITH 2D MX-enes

(71) Applicants: Drexel University, Philadelphia, PA (US); THE PENN STATE RESEARCH FOUNDATION, University Park, PA (US)

(72) Inventors: Yury Gogotsi, Warminster, PA (US); Babak Anasori, Fishers, IN (US); Benjamin Legum, Bluemont, VA (US); Pavel S. Lelyukh, Bristol, PA (US); Clive Alan Randall, State College, PA (US); Jing Guo, Xian Shaanix (CN); Ke Wang, State College, PA (US)

(73) Assignees: Drexel University, Philadelphia, PA (US); THE PENN STATE RESEARCH FOUNDATION, University Park, PA (US)

( * ) Notice: Subject to any disclaimer, the term of this patent is extended or adjusted under 35 U.S.C. 154(b) by 76 days.

(21) Appl. No.: 18/883,435

(22) Filed: Sep. 12, 2024

(65) Prior Publication Data

US 2025/0011244 A1 Jan. 9, 2025

Related U.S. Application Data

(63) Continuation of application No. 17/054,625, filed as application No. PCT/US2019/037283 on Jun. 14, 2019, now abandoned.

(Continued)

(51) Int. Cl.
*C04B 35/56* (2006.01)
*C04B 35/453* (2006.01)
(Continued)

(52) U.S. Cl.
CPC ........ *C04B 35/5618* (2013.01); *C04B 35/453* (2013.01); *C04B 35/645* (2013.01);
(Continued)

(58) Field of Classification Search
None
See application file for complete search history.

(56) References Cited

U.S. PATENT DOCUMENTS

| | | | | |
|---|---|---|---|---|
| 9,193,595 B2 | 11/2015 | Barsoum et al. | | |
| 2007/0049484 A1* | 3/2007 | Kear | C04B 35/80 | 501/103 |

(Continued)

FOREIGN PATENT DOCUMENTS

| | | | |
|---|---|---|---|
| CN | 105363483 A | 3/2016 | |
| CN | 105418072 A * | 3/2016 | C04B 35/265 |

(Continued)

OTHER PUBLICATIONS

A. K. Mukhopadhyay, M. R. Chaudhuri, A. Seal, S. K, Dalui, M. Banerjee, K. K. Phani, "Mechanical characterization of microwave sintered zinc oxide," Bulletin of Materials Science, vol. 24, Apr. 2001, pp. 125-128.

(Continued)

*Primary Examiner* — Seth Dumbris
(74) *Attorney, Agent, or Firm* — BakerHostetler

(57) ABSTRACT

The present disclosure is directed to nanocomposites comprising a co-sintered composition of a MXene crystal form composition and an inorganic oxide, or oxide-type ceramic and methods of making and using the same.

16 Claims, 8 Drawing Sheets

Related U.S. Application Data

(60) Provisional application No. 62/687,521, filed on Jun. 20, 2018.

(51) Int. Cl.
*C04B 35/645* (2006.01)
*H10N 10/01* (2023.01)
*H10N 10/857* (2023.01)

(52) U.S. Cl.
CPC .......... *H10N 10/01* (2023.02); *H10N 10/857* (2023.02); *C04B 2235/3224* (2013.01); *C04B 2235/3284* (2013.01); *C04B 2235/3843* (2013.01); *C04B 2235/604* (2013.01); *C04B 2235/656* (2013.01); *C04B 2235/768* (2013.01); *C04B 2235/785* (2013.01)

(56) References Cited

U.S. PATENT DOCUMENTS

| | | | |
|---|---|---|---|
| 2014/0162130 A1 | 6/2014 | Barsoum et al. | |
| 2017/0088471 A1 | 3/2017 | Randall et al. | |

FOREIGN PATENT DOCUMENTS

| | | | |
|---|---|---|---|
| CN | 107221428 | A | 9/2017 |
| WO | 2012/177712 | A1 | 12/2012 |

OTHER PUBLICATIONS

Alhabeb, M., et al., "Guidelines for Synthesis and Processing of Two-Dimensional Titanium Carbide (Ti3C2Tx MXene)," Chemistry of Materials, vol. 29, Issue 18, Aug. 2017, pp. 7633-7644.
Anasori, B., et al., "2D metal carbides and nitrides (MXenes) for energy storage," Nature Reviews Materials, vol. 2, Issue 2, Jan. 17, p. 29.
B. Marshall, T. Noma, A, G. Evans, "A Simple Method for Determining Elastic-Modulus-to-Hardness Ratios using Knoop Indentation Measurements," Journal of the American Ceramic Society, vol. 65, Issue 10, Oct. 1982, pp. C175-C176.
B. Zhu, D. Li, T. Zhang, Y. Luo, R. Donelson, T. Zhang, Y. Zheng, C. Du, L. Wei, H.Hng, "The improvement of thermoelectric property of bulk ZnO via ZnS addition : influence of intrinsic defects," Ceramics International, vol. 4, No. 6, 2018, pp. 6461-6465.
Balleste, R. M., et al., "2D materials: to graphene and beyond," Nanoscale, vol. 3, Issue 1, 2011, pp. 20-30.
Basu, S., et al., "Deformation Micromechanisms of ZnO Single Crystals as Determined from Spherical Nanoindentation Stress-Strain Curves," vol. 22, Issue 9, Sep. 2007, pp. 2470-2477.
Borysiuk, V. N., et al., "Bending Rigidity of Two-Dimensional Titanium Carbide (MXene) Nanoribbons: A Molecular Dynamics Study," Computational Materials Science, vol. 143, Feb. 15, 2018, pp. 418-424.
Cai, K. F., et al., "Preparation and thermoelectric properties of Al-doped ZnO ceramics, " Materials Science and Engineering B, vol. 104, Issue 1-2, Nov. 2003, pp. 45-48.
Chen, D. S., et al., "One-Step Chemical Synthesis of ZnO/Graphene Oxide Molecular Hybrids for High-Temperature Thermoelectric Applications," ACS Applied Materials & Interfaces, vol. 7, Issue 5, Jan. 21, 2015, pp. 3224-3230.
Coleman, J. N., et al., "Small but strong: A review of the mechanical properties of carbon nanotube-polymer composites," Carbon, vol. 44, Issue 9, Aug. 2006, pp. 1624-1653.
D. C, Look., "Recent advances in ZnO materials and devices," Materials Science and Engineering: B, vol. 80, Issue 1-3, Mar. 22, 2001, pp. 383-387.
D. C. Look, J. W. Hemsky, J, R. Sizelove, "Residual Native Shallow Donor in ZnO," Phys. Rev. Lett., vol. 82, Issue 12, Mar. 1999, pp. 2552-2555.
Fei, et al., "MXene-reinforced alumina ceramic composites", Sep. 9, 2017, Ceramics International, vol. 43, pp. 17206-17210 (Year: 2017).
Funahashi, S., et al., "Demonstration of the cold sintering process study for the densification and grain growth of ZnO ceramics," Journal of the American Ceramic Society, vol. 100, issue 2, Feb. 2017, pp. 546-553.
G. N. Yashin, S. Osswald, p. Vi, G. P. Bogatyreva, Y. Gogotsi, "Effect of sintering on structure of nanodiamond," Diamond and Related Materials, vol. 14, No. 10, Oct. 2005, pp. 1721-1729.
Guo, H. Z., "Cold Sintering Process: A Novel Technique for Low-Temperature Ceramic Processing of Ferroelectrics," Journal American Ceramic Society, vol. 99, Issue 11, Nov. 2016, pp. 3489-3507.
Guo, J., et al., "Cold Sintering Process of Composites: Bridging the Processing Temperature Gap of Ceramic and Polymer Materials," Advanced Functional Materials, vol. 26, Issue 39, Oct. 18, 2016, 7115-7121.
Guo, J., et al., "Cold sintering process: A new era for ceramic packaging and microwave device development," Journal of the American Ceramic Society, vol. 100, Issue 2, Feb. 2017, pp. 669-677.
Guo, J., et al., "Cold Sintering: A Paradigm Shift for Processing and Integration of Ceramics," Angewandte Chemie—Int. Ed Engl, vol. 55, Issue 38, Sep. 12, 2016, pp. 11457-11461.
Gupta., A., et al., "Recent development in 2D materials beyond graphene," Progress in Materials Science vol. 73, Issue 4, Aug. 2015, pp. 44-126.
H. Zhang, L. B. Wang, Chen, p. Li, A. G. Zhou, X. X. Cao, K. Hu, "Preparation, mechanical and anti-friction performance of MXene/polymer composites" Materials & Design, vol. 92, Feb. 15, 2016, pp. 682-689.
Jood, P., et al., "Al-Doped Zinc Oxide Nanocomposites with Enhanced Thermoelectric Properties," Nano Letters, vol. 11, Issue 10, Sep. 26, 2011, pp. 4337-4342.
Khalid, F. A., et al., "Microstructure and interfacial characteristics of aluminium-diamond composite materials," Diamond and Related Materials, vol. 13, issue 3, Mar. 2004, pp. 393-400.
Kim, H., "Thermoelectric Properties of Two-Dimensional Molybdenum-Based MXenes," Chemistry of Materials, vol. 29, Issue 15, Jul. 5, 2017, pp. 6472-6479.
Komameni, S., "Feature article. Nanocomposites," Journal of Materials Chemistry, vol. 2, Issue 12, 1992, pp. 1219-1230.
Kucheyev, S. O., et al., "Mechanical deformation of single-crystal ZnO," Applied Physical Letters, vol. 80, Issue 6, Feb. 1, 2002, pp. 956-958.
L. Vayssieres, "Growth of Arrayed Nanorods and Nanowires of ZnO from Aqueous Solutions," Advanced Materials, vol. 15, Issue 5, Mar. 2003, pp. 464-466.
Li et al., "Synthesis and thermal stability of two-dimensional carbide MXene Ti3C2", Materials Science and Engineering, vol. 191, 2015, pp. 33-40.
Ling, Z., et al., "Flexible and conductive MXene films and nanocomposites with high capacitance," Proceedings of the National Academy of Sciences, vol. 111, Issue 47, Nov. 25, 2014, pp. 16676-16681.
Lipatova, M., et al., "Effect of Synthesis on Quality, Electronic Properties and Environmental Stability of Individual Monolayer Ti3C2 MXene Flakes," vol. 2, Issue 12, Advanced Electronic Materials, Dec. 2016, pp. 30.
Look, D C., et al., "Electrical properties of bulk ZnO," Solid State Communications, vol. 105, Issue 6, Feb. 1998, pp. 399-401.
Mattia, D., et al., "Effect of graphitization on the wettability and electrical conductivity of CVD-carbon nanotubes and films," The journal of Physical Chemistry B, vol. 110, Issue 20, Mar. 24, 2006, pp. 9850-9855.
Mochalin, V. N. et al., "The properties and applications of nanodiamonds," Nature Nanotechnology, vol. 7, Issue 1, Dec 18, 2011, pp. 11-23.
Naguib, M., et al., "Two-Dimensional Nanocrystals Produced by Exfoliation of Ti3AlC2," Advanced Materials, vol. 23, Issue 37, Oct. 4, 2011, pp. 4248-4253.

(56) References Cited

OTHER PUBLICATIONS

Nam, W. H., et al., "High-temperature charge transport and thermoelectric properties of a degenerately Al-doped ZnO nanocomposite," Journal of Materials Chemistry, vol. 22, Issue 29, May 16, 2012, pp. 14633-14638.
Ohta, H., et al., "Thermoelectric Properties of Homologous Compounds in the ZnO—In203 System," Journal of the American Ceramic Society, vol. 79, Issue 8, Aug. 1996, pp. 2193-2196.
Ozgur, U., et al., "A Comprehensive Review of ZnO Materials and Devices," Journal of Applied Physics, vol. 98, No. 4, Aug. 2005, pp. 104.
Ruf, H., et al., "Toughening by Monoclinic Zirconia," Journal of the American Ceramic Society, vol. 66, issue 5, May 1983, pp. 328-332.
Seo, J. H., et al., "Cold sintering approach to fabrication of high rate performance binderless LiFePO4 cathode with high volumetric capacity," Scripta Materialia, vol. 146, Issue 366, Mar. 2018, pp. 267-271.
Shahzad, F, "Electromagnetic interference shielding with 2D transition metal carbides (MXenes)," Science, vol. 353, Issue 6304, Sep. 2016, pp. 1137-1140.
T. K. Roy, "Assessing hardness and fracture toughness in sintered zinc oxide ceramics through indentation technique," Materials Science and Engineering: A, vol. 640, Jul. 29, 2015, pp. 267-274.
Tsubota, T., et al., "Thermoelectric properties of Al-doped ZnO as a promising oxide material for high-temperature thermoelectric conversion," Journal of Materials Chemistry, vol. 7, 1997, pp. 85-90.
Van, C. G., "Hydrogen as a Cause of Doping in Zinc Oxide," Physical Review Letters, vol. 85, No. 5, Jul. 31, 2000, 1012-1015.
Xu., B. S., "Prospects and research progress in nano onion-like fullerenes," New Carbon Materials, vol. 23, Issue 4, Mar. 2008, pp. 289-301.
Zhang, C. F, I., et al., "Oxidation Stability of Colloidal Two-Dimensional Titanium Carbides (MXenes)," Chemistry of Materials, vol. 29, No. 11, May 9, 2017, pp. 4848-4856.
Zhang, C. F., et al., "Transparent, Flexible, and Conductive 2D Titanium Carbide (MXene) Films with High Volumetric Capacitance," Advanced Materials, vol. 29, Issue 36, Sep. 27, 2017, 1702678.
Zhang, Q., et al., "The Road for Nanomaterials Industry: A Review of Carbon Nanotube Production, Post-Treatment, and Bulk Applications for Composites and Energy Storage," Small vol. 9, Issue 8, Apr. 2013, pp. 1237-1265.
Zhao, X., et al., "Introducing a ZnO-PTFE (Polymer) Nanocomposite Varistor via the Cold Sintering Process," Advanced Engineering Materials, vol. 20, Issue 7, Jan. 2018, pp. 1-8.

* cited by examiner

CERAMIC OXIDE COMPOSITES REINFORCED WITH 2D MX-enes

CROSS REFERENCE TO RELATED APPLICATIONS

This application is a continuation of U.S. patent application Ser. No. 17/054,625, filed Nov. 11, 2020; which is the National Stage Application of International Patent Application No. PCT/US2019/037283, filed Jun. 14, 2019; which claims priority to U.S. Patent Application Ser. No. 62/687,521, filed Jun. 20, 2018. All foregoing applications are incorporated herein by reference in their entireties for any and all purposes.

GOVERNMENT RIGHTS

This invention was made with government support under Grant No. FA9550-16-1-0429 awarded by the Air Force Research Laboratory and under Grant No. DMR-1310245 awarded by the National Science Foundation. The government has certain rights in the invention

TECHNICAL FIELD

The present disclosure is directed to nanocomposites comprising co-sintered compositions of MXene compositions and inorganic oxides (or related inorganic material, such as an oxycarbides, oxynitrides, and/or oxycarbonitrides), and methods of making and using the same. While the descriptions are broadly provided, in specific exemplifications, the nanocomposites comprise co-sintered compositions of MXene compositions with ZnO, more specifically MXene compositions having an empirical formula of $Ti_3C_2$, and methods of making and using the same.

BACKGROUND

Nanocomposites containing two-dimensional (2D) materials have attracted much attention in the recent years due to their potential for enhancing electrical, magnetic, optical, mechanical and thermal properties. It is known that the addition of just a few percent of two-dimensional (2D) materials can dramatically modify the properties of matrix materials, such as strength, hardness, and conductivity. However, prior to this disclosure, the integration of nanomaterials into composites was limited to nanomaterials that are compatible and thermally stable at relatively high temperatures (>800° C. under argon), or the integration into systems that do not require high temperatures. However, 2D materials are typically not thermodynamically compatible with the high-temperature and/or high-pressure processing techniques, which are needed for the densification of ceramics. As such, it has been a challenge to integrate 2D materials into ceramic matrices due to interdiffusion and chemical reactions at high temperatures.

The present disclosure addresses at least some of the foregoing problems.

SUMMARY

Herein is described the use of cold sintering processing (CSP) as an efficacious way of providing a wide array of nanocomposite materials comprising inorganic oxides (or related inorganic materials, such as an oxycarbides, oxynitrides, and oxycarobnitrides) and MXene materials. In particular, the descriptions herein are exemplifed by the efficient co-sintering of $Ti_3C_2T_x$ (MXene), a 2D transition carbide, with ZnO, a model oxide matrix, to form ZnO—$Ti_3C_2$ nanocomposites using cold sintering processing (CSP), though the disclosure is not limited to these materials. The ZnO—$Ti_3C_2$ nanocomposites were shown that it is possible to sinter these nanocomposites to 92-98% of the theoretical density at 300° C., thus avoiding oxidation or interdiffusion while showing homogeneous distribution of the 2D materials along the ZnO, and other ceramic oxide grain boundaries. The electrical conductivity of the ZnO—$Ti_3C_2T_x$ nanocomposite was improved by 1-2 orders of magnitude due to the addition of up to 5 wt % MXene. Hardness and elastic modulus showed an increase of 40-50% with 0.5 wt % MXene, and over 150% with 5 wt % of MXene. Again, the successful densification of MXene into ZnO to create a functional nanocomposite demonstrated that the cold sintering of ceramics with 2D materials opens up a processing route for design of a wide array of nanocomposites for a diverse range of applications.

Embodiments of the present disclosure include those nanocomposites comprising a co-sintered composition of a MXene composition and an inorganic oxide (or related inorganic material, such as an inorganic oxycarbide, oxynitride, or oxycarbonitride, or a combination thereof).

Additionally or alternatively, the nanocomposites comprise a co-sintered composition of a MXene composition and an inorganic binary, ternary, or quaternary oxide.

Alternatively, or additionally, the inorganic oxide (or related inorganic material, such as an oxycarbide, oxynitride, oxycarbonitride) comprises one or more alkali metal (Group 1 of the Periodic Table; e.g., including oxides of lithium, sodium, potassium, rubidium, and/or cesium), alkaline earth metal (Group 2 of the Periodic Table; e.g., including oxides of Be, Mg, Ca, Sr, and Ba), transition metal (comprising elements of Groups 3-12 of the Periodic Table), lanthanide and actinide metal (as conventionally defined), and/or metalloid (comprising elements of Groups 13-16 of the Periodic Table; e.g., including oxides of Al, Ga, In, Sn, Bi, Sb, P, or Pb).

Additionally or alternatively the inorganic oxide (or related inorganic material, such as an oxycarbide, oxynitride, oxycarbonitride) comprises Ti, Zr, Hf, V, Nb, Ta, Cr, Mo, W, Mn, Re, Fe, Ru, Os, Co, Rh, Ir, Ni, Pd, Pt, Cu, Ag, Au, Zn, Cd, Al, Ga, In, Ge, Sn, Pb, Bi, or a combination thereof. In certain independent embodiments, the nanocomposite comprises (a) one or more oxide of In, Ti, Sn, Zn, Zr, or a combination thereof; (b) one or more oxide of Co, Mn, Nb, Pb, Ta, Ti, W, Zn, and Zr; (c) a ferrite, a nickelate, a niobate, a ruthenate, a tantalate, a titanate, a tungstate, a vanadate, a zirconate, or a combination or mixture thereof; and/or (d) ZnO.

In certain additional independent embodiments, the nanocomposites further comprise one or more lanthanide metal oxides incorporated in the inorganic oxide, oxycarbide, oxynitride, or oxycarbonitride.

In certain additional independent embodiments, the inorganic oxide (or related inorganic material, such as an oxycarbide, oxynitride, oxycarbonitride) of the nanocomposite is present in a perovskite structure.

The MXene component of these nanocomposites can be or can be derived from any of the compositions described in any one of U.S. patents application Ser. No. 14/094,966, International Applications PCT/US2012/043273, PCT/US2013/072733, PCT/US2015/051588, PCT/US2016/020216, or PCT/US2016/028,354. Specific such compositions are described elsewhere herein. In certain embodiments, the MXenes comprise substantially two-dimensional array of crystal cells, each crystal cell having an empirical formula of $M_{n+1}X_n$, or $M'_2M''_nX_{n+1}$, where M, M', M'', and X are defined elsewhere herein. Those descriptions are incorporated here. In some independent embodiments, M is Ti or Ta. Additionally, or alternatively, X is C. The specification exemplifies the use of $Ti_3C_2T_x$ as a precursor to, or as incorporated into, the nanocomposites Additionally, in certain embodiments, the inorganic oxycarbide, oxynitride, oxycarbonitride, or oxide, or a combination thereof are present as grains within the nanocomposite, the grains having dimensions in the nanometer or micron range, though preferably in a range of from 100 nm to 900, or a sub-range thereof. Smaller grain sizes appear to enure certain superior mechanical and/or electrical properties to the nanocomposites which, when coupled with the electrical properties associated with the MXene compositions, offer nanocomposites of superior performance.

Additionally or alternatively, the MXene composition is distributed along the grain boundaries of the sintered nanocomposite. Additionally, or alternatively, the MXene composition is distributed substantially homogeneously throughout the nanocomposite. Additionally, or alternatively the MXene composition is present in an amount of about 1%, 2%, 3%, 4%, 5%, 6%, 7%, 8%, 9%, 10%, 15%, 20%, or 25% by weight relative to the weight of the entire composition, or a composition range defined by two or these values.

In certain additional or alternative embodiments, the nanocomposite exhibits a density greater than 80%, greater than 85%, greater than 90%, greater than 92%, greater than 94%, greater than 96% to about 98% of the theoretical density of the nanocomposite.

Additionally or alternatively, the nanocomposite exhibits a hardness, and/or elastic modulus that is at least 10%, 20%, 30%, 40%, 50%, or 100%, in some cases to about 500% greater than an otherwise equivalent nanocomposite not containing the MXene composition or prepared under otherwise equivalent conditions in the absence of the MXene composition.

Additionally or alternatively, the nanocomposite exhibits an electric conductivity that is at least 10%, 20%, 30%, 40%, 50%, 100%, 250%, 500%, or 1000%, in some cases to about 10 times, 100 times, or 1000 times greater than an otherwise equivalent nanocomposite not containing the MXene composition or prepared under otherwise equivalent conditions in the absence of the MXene composition.

Additionally or alternatively, the nanocomposite can be prepared by cold sintering, preferably at a temperature of 750° C. or less, 500° C. or less, preferably 400° C. or less, more preferably 300° C. or less.

This disclosure also comprises embodiments directed to the making and using of these nanocomposites.

For example, certain embodiments provide methods comprising (a) mixing a MXene composition, such as otherwise described herein, and an inorganic oxide (or related inorganic material, such as an oxycarbide, oxynitride, oxycarbonitride, oxide, or a combination thereof), such as otherwise described herein, into a homogeneous mixture; (b) compacting the mixture into a compact form; and (c) cold sintering the compact form at a temperature of 500° C. or less, preferably 400° C. or less, more preferably 300° C. or less. The cold sintering may be done using one or more heat treatments, preferably at a temperature of 750° C. or less, 500° C. or less, preferably 400° C. or less, more preferably 300° C. or less. The compacting and/or cold sintering can be done under a pressure ranging from 50 MPa to 600 MPa, or a sub-range therewithin. The methods may further comprise heat treating the as-prepared nanocomposites at elevated temperatures (e.g., in a range of from about 350° C. to about 1000° C., or a sub-range therein), preferably under inert atmosphere. In some cases, the colder sintering further comprises pressure-assisted transient liquid phase sintering. In some cases, this can be done where homogeneous mixture compacted into the compact form may further contain a carboxylic acid, such as acetic acid, as a separate embodiment. The methods described herein result in the formation of one of the nanocomposites described herein

BRIEF DESCRIPTION OF THE DRAWINGS

The present application is further understood when read in conjunction with the appended drawings. For illustrating the subject matter, there are shown in the drawings exemplary embodiments of the subject matter; however, the presently disclosed subject matter is not limited to the specific methods, devices, and systems disclosed. In addition, the drawings are not necessarily drawn to scale.

(FIGS. 10(D-F)).

FIGS. 11(A-B) graphs the mechanical properties of ZnO—$Ti_3C_2$ nanocomposites cold sintered at 300° C. for 1 hour.

DETAILED DESCRIPTION OF ILLUSTRATIVE EMBODIMENTS

Figure 1:
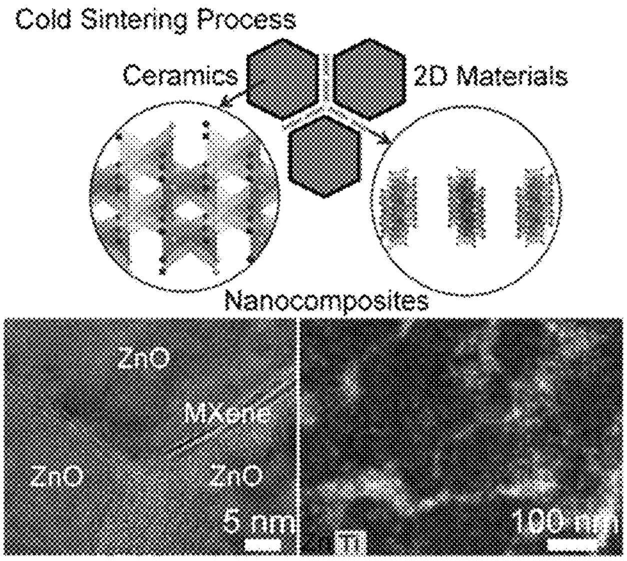
FIG. 1 provides a schematic representation the grains and grain boundary aspects of one exemplary embodiment.

The present disclosure is directed to novel compositions comprising co-sintered inorganic oxides and MXene compositions and methods of making and using these compositions. More specifically, these compositions comprise nanocomposite comprising a co-sintered composition of a MXene composition and an inorganic oxide (or related inorganic material, such as an oxycarbide, oxynitride, oxycarbonitride). Additionally, or alternatively, the nanocomposite may be described as an inorganic matrix comprising inorganic oxide grains with grain boundaries comprising or derived from crystalline MXene materials. To the knowledge of the inventors, this is the first report of using 2D MXenes in these types of ceramic materials. Additionally, this is believed to be the first report using a 2D materials with cold sintering for ceramic oxide composites. The resulting nanocomposite can be sintered at significantly lower temperature compared to the traditional sintering temperature of composites, while having higher electrical conductivity and mechanical properties As shown elsewhere herein, the MXene materials in the grain boundaries of the nanocomposites separating the grains of the inorganic oxides (or related inorganic material, such as an oxycarbide, oxynitride, oxycarbonitride). These compositions can be prepared by a process known as cold sintering or cold sintering processing (CSP) and take advantage of the unexpected ability of MXene materials to facilitate the sintering of these inorganic materials while inhibiting growth of the co-sintered inorganic oxide (or related inorganic material, such as an oxycarbide,) grains during this sintering. In the case of ZnO, and presumably other materials as well, this feature is believed to be responsible for the unexpectedly superior mechanical and electrical properties (e.g., conductivity, etc.) of these composites, relative to otherwise identical materials that are absent the MXene grain boundaries. Even though the disclosure is exemplified by the use of ZnO—$Ti_3C_2$ nanocomposites, the observations made with respect to these materials support an understanding that the descriptions herein are applicable to a much wider array of both inorganic oxides, etc. and MXenes In certain embodiment, the disclosed nanocomposites comprise co-sintered compositions of a MXene composition and an inorganic oxide (or related inorganic material, such as an oxycarbide, oxynitride, oxycarbonitride). For the sake of brevity, in some cases, these types of oxide materials may be described herein as oxide or oxide-type materials, reflective of the fact that all these materials contain oxygen atoms in their lattices, resulting in some cases from the reaction of mixed carbides, nitrides, and oxides. It is intended that reference to inorganic oxides includes oxycarbides, oxynitrides, and oxycarbonitrides, and each type of such material may be considered an additional independent embodiment where the term inorganic is used herein. While it is not known for certain, and not necessarily being bound by any particular theory, it is believed that these lattice oxygen atoms in these materials are, at least in part, useful or responsible for the interaction with the surfaces typically associated with MXene materials.

In certain of these embodiments, the nanocomposite comprises a co-sintered inorganic oxide, including, but not limited to binary, ternary, or quaternary oxides. That is, the oxide or oxide-type material may be of a general formula $M_xO_y$, $M_xM'_{x'}O_y$, $M_xM'_{x'}M''_{x''}O_y$, and so on, where M, M', and M" represent different metal or metalloid elements, and x, x', x", and y refer to different amounts of these metals within a general oxide lattice. For example, $M_xO_y$ may refer to BaO, ZnO, or $SnO_2$, as exemplary, non-limiting binary oxides, $M_xM'_{x'}O_y$ may be exemplified as ternary oxides $Al_2O_3$ or $BaTiO_3$, and so on.

The use of the MXene materials as grain boundary additives in these nanocomposites is believed to be generally useful for most, if not all inorganic oxide or oxide-type materials. While exemplified herein with ZnO, in independent embodiments, these inorganic oxides (or related inorganic material, such as an oxycarbide, oxynitride, oxycarbonitride) comprise one or more alkali metal (Group 1 of the Periodic Table; e.g., including oxides of lithium, sodium, potassium, rubidium, and/or cesium), alkaline earth metal (Group 2 of the Periodic Table; e.g., including oxides of Be, Mg, Ca, Sr, and Ba), transition metal (comprising elements of Groups 3-12 of the Periodic Table), lanthanide and actinide metal, and/or metalloid (comprising elements of Groups 13-16 of the Periodic Table; e.g., including oxides of Al, Ga, In, Sn, Bi, Sb, P, or Pb). In specific embodiments, the inorganic oxycarbide, oxynitride, oxycarbonitride, or oxide comprises one or more oxide of Sc, Y, Ti, Zr, Hf, V, Nb, Ta, Cr, Mo, W, Mn, Re, Fe, Ru, Os, Co, Rh, Ir, Ni, Pd, Pt, Cu, Ag, Au, Zn, Cd, Al, Ga, In, Ge, Sn, Pb, Bi, or a combination thereof.

It is to be appreciated that each of these individual oxides or combination of oxides represent independent embodiment and should be interpreted every bit as much as if each had been listed individually or in individual combinations.

For example, in certain embodiments, these oxide or oxide-type materials comprise In, Ti, Sn, Zn, Zr, or a combination thereof, preferably in their oxide forms. These oxides share a characteristic of being electrically conductive or having the capacity to be electrically conductive. At this point, it is worth noting that not only are the nanocomposites comprising these oxides considered within the scope of the present disclosure, but so too are the devices which comprise these nanocomposites.

In another example, in certain embodiments, these oxide or oxide-type materials comprise Co, Mn, Nb, Pb, Ta, Ti, W, Zn, and Zr, or a combination thereof. These oxides are typically found in compositions used in capacitors and other electronic devices. In certain of these embodiments, the nanocomposite compositions may additionally and/or alternatively independently include Ba, K, Mg, Na, and Sr oxides. Additionally, and/or alternatively, in independent embodiments, these oxides, nanocomposites, or compositions thereof exhibit ferroelectric behavior. In certain of these embodiments, these compositions contain BaO and/or PbO. Certain of these embodiments include lead titanate, barium titanate, lead zirconate, lead zirconate titanate, or lead magnesium niobate, to name only a few exemplars. Additionally, or alternatively, in independent embodiments, these oxides, nanocomposites, or compositions thereof exhibit antiferroelectric, ferroelastic, ferroelectric, ferromagnetic, flexoelectric, paraelectric, piezoelectric, and/or pyroelectric behavior. Such materials may comprise lead or be lead-free. In exemplary embodiments, the oxide or oxide-type materials in the nanocomposites comprise such exemplary materials as barium titanate ($BaTiO_3$), lead zirconate titanate (Pb $[Zr_xTi_{1-x}]O_3$ with $0 \le x \le 1$), potassium niobate ($KNbO_3$), sodium tungstate ($Na_2WO_3$), $Ba_2NaNb_5O_5$, $Pb_2KNb_5O_{15}$, zinc oxide (ZnO) (cubic or hexagonal, especially hexagonal Wurtzite), sodium potassium niobate ($(K,Na)NbO_3$) (also known as NKN or KNN), bismuth ferrite ($BiFeO_3$), sodium niobate ($NaNbO_3$), barium titanate ($BaTiO_3$), bismuth titanate ($Bi_4Ti_3O_{12}$), sodium bismuth titanate ($NaBi(TiO_3)_2$). Again, as described elsewhere herein, not only are the nanocomposites comprising these oxides or oxide-type materials considered within the scope of the present disclosure, but so too are the devices which comprise these nanocomposites.

In still another example, in certain embodiments, the nanocomposites comprise one or more ferrite, nickelate, niobate, ruthenate, tantalate, titanate, tungstate, vanadate, zirconate, or combination or mixture thereof. These materials may optionally be doped with other oxide materials described herein, depending on the intended application, and the person of skill in the art will recognize those dopants needed for a given application.

In still another example, in certain embodiments, the nanocomposites comprise ZnO, as exemplified herein. Again, ZnO itself, and the nanocomposites described herein, is an important semiconducting material, which is useful or has potential for use in a broad range of applications, such as varistors, thermoelectrics, optoelectronics, piezoelectric transducers, photocatalysts, and gas sensors. Again, as described elsewhere herein, not only are the nanocomposites comprising ZnO considered within the scope of the present disclosure, but so too are these devices which comprise these nanocomposites.

In still another example, in certain embodiments, the nanocomposites comprise or further comprise one or more lanthanide or actinide metal oxide. For the sake of completeness, included in this description are those oxides at least of Y, La, Ce, Pr, Nd, Pm, Sm, Eu, Gd, Tb, Dy, Ho, Er, Tm, Yb, or Lu. Again, as set forth elsewhere, nanocomposites comprising each of these individual oxides or combination of oxides is considered an independent embodiment, as if listed individually or in an individual combination. Specific embodiments within this example include those where the inorganic oxide or oxide-type material is or comprises yttria and/or scandia stabilized zirconia, Gd doped ceria, lanthanum strontium cobalt ferrite, and lanthanum strontium manganite. Such compositions are useful in solid fuel cell compositions. Both these compositions and the devices derived therefrom are considered within the scope of this disclosure.

In still another example, in certain embodiments, the oxides or oxide-type materials of the nanocomposites have a perovskite or perovskite-like structure. While it is believed that a person of skill in the art would appreciate this description, it is further elaborated elsewhere herein.

Returning to the original description of the nanocomposites described herein, these nanocomposites comprise or are derived from one or more MXene compositions, in addition to the one or more oxide or oxide-type material. And again, typically, these MXene compositions exist within the grain boundaries of the nanocomposite matrix. The MXene compositions described herein are also sometimes described in terms of the phrase "MX-enes" or simply "MX-enes." Most of the MXenes synthesized to date have metallic conductivity. For example, the two-dimensional titanium carbide, $Ti_3C_2T_x$, which is the mostly studied MXene, has conductivity in the range of $10^3$-$10^4$ S $cm^{-1}$ for both individual flakes as well as in stacked films. MXenes have shown great promise for a variety of applications including energy storage, electromagnetic interference shielding, sensors, water purifications, and medicine.

In certain aspects, MXenes are two-dimensional transition metal carbides, nitrides, or carbonitrides comprising at least one layer having first and second surfaces, each layer described by a formula $M_{n+21}X_nT_x$ and comprising:

a substantially two-dimensional array of crystal cells, each crystal cell having an empirical formula of $M_{n+1}X_n$, such that each X is positioned within an octahedral array of M, wherein M is at least one Group IIIB, IVB, VB, or VIB metal, wherein each X is C, N, or a combination thereof;

n=1, 2, or 3; and wherein $T_x$ represents surface termination groups.

These so-called MXene compositions have been described in U.S. Pat. No. 9,193,595 and Application PCT/US2015/051588, filed Sep. 23, 2015, each of which is incorporated by reference herein in its entirety at least for its teaching of these compositions, their (electrical) properties, and their methods of making. That is, any such composition described in this Patent is considered as applicable for use in the present applications and methods and within the scope of the present invention. For the sake of completeness, M can be at least one of Sc, Y, Lu, Ti, Zr, Hf, V, Nb, Ta, Cr, Mo, or W. In certain embodiments in this class, M is at least one Group IVB, Group VB, or Group VIB metal, preferably Ti, Mo, Nb, V, or Ta. Certain of these compositions include those having one or more empirical formula wherein $M_{n+1}X_n$ comprises $Sc_2C$, $Ti_2C$, $V_2C$, $Cr_2C$, $Cr_2N$, $Zr_2C$, $Nb_2C$, $Hf_2C$, $Ti_3C_2$, $V_3C_2$, $Ta_3C_2$, $Ti_4C_3$, $V_4C_3$, $Ta_4C_3$, $Sc_2N$, $Ti_2N$, $V_2N$, $Cr_2N$, $Cr_2N$, $Zr_2N$, $Nb_2N$, $Hf_2C$, $Ti_3N_2$, $V_3C_2$, $Ta_3C_2$, $Ti_4N_3$, $V_4C_3$, $Ta_4N_3$ or a combination or mixture thereof. In particular embodiments, the $M_{n+1}X_n$ structure comprises $Ti_3C_2$, $Ti_2C$, or $Ta_4C_3$. In some embodiments, M is Ti or Ta, and n is 1, 2, or 3, for example having an empirical formula $Ti_3C_2$ or $Ti_2C$. In some of these embodiments, at least one of said surfaces of each layer has surface terminations comprising hydroxide, oxide, sub-oxide, or a combination thereof. In certain preferred embodiments, the MXene composition is described by a formula $M_{n+1}X_nT_x$, where $M_{n+1}X_n$ are $Ti_2CT_x$, $Mo_2TiC_2T_x$, $Ti_3C_2T_x$, or a combination thereof, and $T_x$ is as described herein. Those embodiments wherein M is Ti, and n is 1 or 2, preferably 2, are especially preferred.

Additionally, or alternatively, in other embodiments, the articles of manufacture and methods use compositions, wherein the two-dimensional transition metal carbide, nitrides, or carbonitride comprises a composition having at least one layer having first and second surfaces, each layer comprising:

a substantially two-dimensional array of crystal cells, each crystal cell having an empirical formula of $M'_2M''_nX_{n+1}$, such that each X is positioned within an octahedral array of M' and M'', and where $M''_n$ are present as individual two-dimensional array of atoms intercalated (sandwiched) between a pair of two-dimensional arrays of M' atoms, wherein M' and M'' are different Group IIIB, IVB, VB, or VIB metals (especially where M' and M'' are Ti, V, Nb, Ta, Cr, Mo, or a combination thereof), wherein each X is C, N, or a combination thereof, preferably C; and n=1 or 2.

These compositions are described in greater detail in Application PCT/US2016/028354, filed Apr. 20, 2016, which is incorporated by reference herein in its entirety at least for its teaching of these compositions and their methods of making. In some embodiments, M' is Mo, and M'' is Nb, Ta, Ti, or V, or a combination thereof. In other embodiments, n is 2, M' is Mo, Ti, V, or a combination thereof, and M'' is Cr, Nb, Ta, Ti, or V, or a combination thereof. In still further embodiments, the empirical formula $M'_2M''_nX_{n+1}$ comprises $Mo_2TiC_2$, $Mo_2VC_2$, $Mo_2TaC_2$, $Mo_2NbC_2$, $Mo_2Ti_2C_3$, $Cr_2TiC_2$, $Cr_2VC_2$, $Cr_2TaC_2$, $Cr_2NbC_2$, $Ti_2NbC_2$, $Ti_2TaC_2$, $V_2TaC_2$, or $V_2TiC_2$, preferably $Mo_2TiC_2$, $Mo_2VC_2$, $Mo_2TaC_2$, or $Mo_2NbC_2$, or their nitride or carbonitride analogs. In still other embodiments, $M'_2M''_nX_{n+1}$ comprises $Mo_2Ti_2C_3$, $Mo_2V_2C_3$, $Mo_2Nb_2C_3$, $Mo_2Ta_2C_3$, $Cr_2Ti_2C_3$, $Cr_2V_2C_3$, $Cr_2Nb_2C_3$, $Cr_2Ta_2C_3$, $Nb_2Ta_2C_3$, $Ti_2Nb_2C_3$, $Ti_2Ta_2C_3$, $V_2Ta_2C_3$, $V_2Nb_2C_3$, or $V_2Ti_2C_3$, preferably $Mo_2Ti_2C_3$, $Mo_2V_2C_3$, $Mo_2Nb_2C_3$, $Mo_2Ta_2C_3$, $Ti_2Nb_2C_3$, $Ti_2Ta_2C_3$, or $V_2Ta_2C_3$, or their nitride or carbonitride analogs.

Each of these compositions having empirical crystalline formulae $M_{n+1}X_n$ or $M'_2M''_nX_{n+1}$ are described in terms of comprising at least one layer having first and second surfaces, each layer comprising a substantially two-dimensional array of crystal cells. In some embodiments, these compositions comprise layers of individual two-dimensional cells. In other embodiments, the compositions comprise a plurality of stacked layers.

In their free state, at least one of said surfaces of each layer of the MXene structures has surface terminations (optionally designated "$T_s$" or "$T_x$") comprising alkoxide, carboxylate, halide, hydroxide, hydride, oxide, sub-oxide, nitride, sub-nitride, sulfide, thiol, or a combination thereof. In some embodiments, at least one of said surfaces of each layer has surface terminations comprising alkoxide, fluoride, hydroxide, oxide, sub-oxide, or a combination thereof. In still other embodiments, both surfaces of each layer have said surface terminations comprising alkoxide, fluoride, hydroxide, oxide, sub-oxide, or a combination thereof. As used herein the terms "sub-oxide," "sub-nitride," or "sub-sulfide" is intended to connote a composition containing an amount reflecting a sub-stoichiometric or a mixed oxidation state of the M metal at the surface of oxide, nitride, or sulfide, respectively. For example, various forms of titania are known to exist as $TiO_x$, where x can be less than 2. Accordingly, the surfaces of the present invention may also contain oxides, nitrides, or sulfides in similar sub-stoichiometric or mixed oxidation state amounts.

It should be appreciated that while forming the disclosed nanocomposites, the surface terminations which exist in "free" MXenes, are likely, in part or in whole, removed from the surfaces of the MXene materials, being replaced by bonding sites originally associated with the oxide or oxide-type materials, such that they are not present in the nanocomposites themselves. Since it is impossible to measure the degree to which such replacement has occurred in any given nanocomposite structure, such nanocomposites may properly be described as alternatively having or not having this $T_x$ or $T_s$ layer associated the MXene phase. For example, the some of the nanocomposites disclosed herein are labeled as $ZnO—Ti_3C_2T_x$, but these can equally be described in terms of $ZnO—Ti_3C_2$, reflecting the fact that the crystalline features of the MXene materials are incorporated into the nanocomposite matrix, without rendering the nature of the composite structure ambiguous or indefinite. Indeed, depending on the specific conditions of the cold sintering process, both may be correct.

As described elsewhere herein, these nanocomposites may be described as comprising grains (grains being the crystalline oxide particles within the nanocomposite matrices) of the inorganic oxide or oxide-type material, with the incorporated MXene compositions being positioned or distributed within the grain boundaries of the nanocomposite matrix. Preferably, these MXene compositions are distributed substantially homogeneously throughout the grain boundary network or the nanocomposite. Additionally, or alternatively, the MXenes may exist within the composite body as a gradient. As a grain boundary material, the MXene is typically present in the nanocomposite at levels of about 1%, 2%, 3%, 4%, or 5%, by weight relative to the weight of the entire composition, but depending on the nature of the specific materials, the MXene compositions may also be present at levels of about 6%, 7%, 8%, 9%, 10%, 15%, 20%, or 25% by weight relative to the weight of the entire composition. In other embodiments, the amount of MXene in the nanocomposition may also be described in terms of ranges, where any two of the preceding levels (i.e., 1 to 25 wt %) define the end-points of such ranges (e.g., from 1 to 2 wt %, from 3 to 6 wt %, etc.).

While the grains of the inorganic oxide or oxide-type material can be of any size, they are preferably nanodimensioned (i.e., having at least one, but preferably all dimensions in the nanometer range, from 1 nm to 999 nm). Sintered nanosized grains provide for the superior mechanical and electrical characteristics of the nanocomposites. The ability of the MXene materials to inhibit grain growth during the cold sintering process is a surprising and unexpected result that allows for these nanocomposites to retain such nanoscaled grain sizes even after such sintering. In specific embodiments, the inorganic oxycarbide, oxynitride, oxycarbonitride, or oxide, or a combination thereof (.e., the oxide or oxide-type materials) are present as grains within the nanocomposite, the grains having dimensions in a range of from 100 nm to 200 nm, 200 nm to 300 nm, 300 nm to 400 nm, 400 nm to 500 nm, 500 nm to 600 nm, 600 nm to 700 nm, 700 nm to 800 nm, 800 nm to 900 nm, or any combination of two or more of the foregoing ranges, for example from 200 nm to 600 nm.

This small grain size allows, at least in part, for the high packing densities associated with these disclosed nanocomposites. Additionally, or alternatively, in certain independent embodiments, these disclosed nanocomposites exhibit sintered densities of at least 80%, or greater than 85%, greater than 90%, greater than 92%, greater than 94%, greater than 96% to about 98% of the theoretical density of the nanocomposite. Additionally, or alternatively, in certain embodiments, these disclosed nanocomposites exhibit sintered densities of at least 80%, or greater than 85%, greater than 90%, greater than 92%, greater than 94%, greater than 96% to about 98% of the density (theoretical or actual) of the inorganic oxide or oxide-type material processed in the absence of the MXene composition.

These nanocomposites exhibit mechanical and electric properties superior to those structures not incorporating the MXene materials. While not being bound by any particular theory, it is possible that each of electrical conductivity, hardness, and/or elastic modulus benefit either from the fine grains associated with these nanocomposites, or the complementary properties associated with the MXene materials (e.g., electrical conductivity, shielding, etc.).

Additionally, or alternatively, in certain embodiments, the nanocomposite exhibits a hardness that is at least 10%, 20%, 30%, 40%, 50%, or 100% greater, in some cases to about 500% or more greater than an otherwise equivalent nanocomposite not containing the MXene composition or prepared under otherwise equivalent conditions in the absence of the MXene composition.

Additionally, or alternatively, in certain embodiments, the nanocomposite exhibits an elastic modulus that is at least 10%, 20%, 30%, 40%, 50%, or 100% greater, in some cases to about 500% or more greater than an otherwise equivalent nanocomposite not containing the MXene composition or prepared under otherwise equivalent conditions in the absence of the MXene composition.

Additionally, or alternatively, in certain embodiments, the nanocomposite exhibits an electric conductivity that is at least 10%, 20%, 30%, 40%, 50%, 100%, 250%, or 500% greater, in some cases to about 5 times, 10 times, 100 times or 1000 times greater than an otherwise equivalent nanocomposite not containing the MXene composition or prepared under otherwise equivalent conditions in the absence of the MXene composition.

Additionally, or alternatively, in certain embodiments, the nanocomposite exhibits semi-conductive behavior.

Additionally, or alternatively, in certain embodiments, the nanocomposite is electrically conductive. In some of these embodiments, the nanocomposite exhibits metallic conductivity Additionally, or alternatively, in certain embodiments, the nanocomposite is electrically non-conductive, capable of serving as a dielectric material.

Additionally, or alternatively, in certain embodiments, the nanocomposite can act as an electromagnetic shield, when positioned appropriately.

Additionally, or alternatively, in certain embodiments, the nanocomposite is prepared by one of the methods described as follows.

Methods of Making the Nanocomposites

To this point, the disclosure has focused on the nanocomposites themselves, but this disclosure also embraces the methods of making these nanocomposites. While the methods disclosed herein may be useful for preparing these materials and, in certain embodiments these nanocomposites may be defined by their methods of making, the nanocomposites are not necessarily defined by these methods.

In certain embodiments, the nanocomposites may be prepared by a process known as cold sintering or a cold sintering process (CSP). Cold sintering processing (CSP), a low temperature sintering process (≤300° C.) for the densification of ceramics, provides a processing environment compatible with nano- and 2D materials, such as MXenes. In certain embodiments, CSP is a pressure-assisted transient liquid phase sintering, where the liquid (preferably aqueous) phase undergoes evaporation during sintering. With capillary force in conjunction with locally applied force, a dissolution-precipitation process occurs, leading to the mass transport of the ceramic particles, in this case the inorganic oxide or oxide-type materials, which minimizes the surface free energy as well as removes the porosity. As demonstrated herein, the relatively low sintering temperatures of CSP work well for the compaction of thermodynamically incompatible materials.

To date, MXenes have been only used as the reinforcement for polymer composites and no study is available on MXene-metal or MXene-ceramic nanocomposites. MXenes are ~1 nm thick sheets of transition metal carbides which are susceptible to oxidation in air, and the oxidation has been shown to be accelerated at temperatures higher than 350° C. Therefore, traditional high temperature processes are not the best route for fabrication of MXene composites. However, this issue, as shown herein, can be avoided or mitigated by cold sintering process because of sintering temperatures ≤300° C. Additionally, as described elsewhere herein, the oxide-like surfaces of MXenes appear to offer the compatible integration in the oxide matrix of a ceramic, like ZnO.

More specifically, certain embodiments of the present disclosure include those methods comprising:

(a) distributing a MXene precursor composition, such as described elsewhere herein, and an inorganic oxide (or related inorganic material, such as an inorganic oxycarbide, oxynitride, or oxycarbonitride) into a homogeneous mixture;

(b) compacting the mixture into a compact form; and (c) cold sintering the compact form at a temperature of 500° C. or less, preferably 400° C. or less, more preferably 300° C. or less. These methods can be used to prepare any of the nanocomposites described herein.

That is, the (precursor) MXene compositions and the inorganic oxides (or related inorganic material, such as an inorganic oxycarbides, oxynitrides, oxycarbonitrides) used in these methods are consistent with those set forth with respect to the nanocomposites.

In this regard, specifically with respect to the size of the precursor powders, which ultimately form the grains of the nanocomposite matrices, and need be smaller than the grains sizes described for the resulting nanocomposites. It is remarkable and unexpected that the MXene materials are so efficient at inhibiting grain growth of these inorganic oxide or oxide-type materials during the colder sintering process. The reason for this efficiency is not entirely understood. But, while not intending to be bound by the correctness or incorrectness of any particular theory, it may be possible that the lattice linkages of the MXene crystal phases constrain or inhibit grain growth, once the MXene surfaces bond or attach to the inorganic oxide surfaces.

In certain embodiments, the compacting is done at a pressure in a range of from 50 MPa to 100 MPa, from 100 MPa to 150 MPa, from 150 MPa to 200 MPa, from 200 MPa to 225 MPa, from 225 MPa to 250 MPa, from 250 MPa to 275 MPa, from 275 MPa to 300 MPa, from 300 MPa to 325 MPa, from 325 MPa to 350 MPa, from 350 MPa to 400 MPa, from 400 MPa to 450 MPa, from 450 MPa to 500 MPa, from 500 MPa to 600 MPa, or a combination of two or more of the foregoing ranges, for example, from 225 MPa to 275 MPa.

In certain specific embodiments, the cold sintering also involves pressure-assisted transient liquid phase sintering, where the liquid (preferably aqueous) undergoes evaporation during sintering. Especially as related to ZnO, the homogeneous mixture compacted into the compact form contains a carboxylic acid, such as acetic acid. The reasons for including such materials are set forth elsewhere herein.

Additionally, or alternatively, the cold sintering may be conducted at one or more temperature of 500° C. or less, preferably 400° C. or less, more preferably 300° C. or less, for example, in a range of from 150° C. to 200° C., from 200° C. to 250° C., from 250° C. to 300° C., from 300° C. to 350° C., from 350° C. to 400° C., from 400° C. to 500° C., or the range may be defined by two or more of the foregoing ranges, for example from 250° C. to 350° C. These sintering may be done in the presence or absence of extraneous pressure. If present, the pressures are the same or similar to those previously described for the compaction. Additionally, or alternatively, the cold sintering may be independently done in an oxidative or inert atmosphere, depending the properties desired for the final product. But for most applications, the cold sintering is done in the presence of air or oxygen.

Despite these relatively low temperatures, the nanocomposites can be formed in times ranging from 1 to 5 hours with high conversions.

In certain circumstances, it may be desirable to subject the as-formed nanocomposites to heat treatment at elevated temperatures, for example, at one or more temperatures in a range of from 350° C. to 400° C., from 400° C. to 450° C., from 450° C. to 500° C., from 500° C. to 550° C., from 550° C. to 600° C., from 600° C. to 650° C., from 650° C. to 700° C., from 700° C. to 750° C., from 750° C. to 800° C., from 800° C. to 850° C. to 900° C., from 900° C. to 950° C., from 950° C. to about 1000° C., or in a ranged defined by two or more of the foregoing ranges, for example from 700° C. to 900°

C. While such heat treatments may be conducted under oxidative, reductive, or inert conditions, again depending on the nature of the product ultimately desired or required, these nanocomposites appear to tolerate such heat treatments inert conditions, for example under argon or nitrogen atmospheres.

General Terms

In the present disclosure the singular forms “a,” “an,” and “the” include the plural reference, and reference to a particular numerical value includes at least that particular value, unless the context clearly indicates otherwise. Thus, for example, a reference to “a material” is a reference to at least one of such materials and equivalents thereof known to those skilled in the art.

When a value is expressed as an approximation by use of the descriptor “about,” it will be understood that the particular value forms another embodiment. In general, use of the term “about” indicates approximations that can vary depending on the desired properties sought to be obtained by the disclosed subject matter and is to be interpreted in the specific context in which it is used, based on its function. The person skilled in the art will be able to interpret this as a matter of routine. In some cases, the number of significant figures used for a particular value may be one non-limiting method of determining the extent of the word “about.” In other cases, the gradations used in a series of values may be used to determine the intended range available to the term “about” for each value. Where present, all ranges are inclusive and combinable. That is, references to values stated in ranges include every value within that range.

It is to be appreciated that certain features of the invention which are, for clarity, described herein in the context of separate embodiments, may also be provided in combination in a single embodiment. That is, unless obviously incompatible or specifically excluded, each individual embodiment is deemed to be combinable with any other embodiment(s) and such a combination is considered to be another embodiment. Conversely, various features of the invention that are, for brevity, described in the context of a single embodiment, may also be provided separately or in any sub-combination. Finally, while an embodiment may be described as part of a series of steps or part of a more general structure, each said step may also be considered an independent embodiment in itself, combinable with others.

Those features and descriptions associated with or attributed to the nanocomposite compositions themselves, and the components or precursors thereof, are also attributable to the methods of making and using these nanocomposite compositions, and vice versa.

The transitional terms “comprising,” “consisting essentially of,” and “consisting” are intended to connote their generally in accepted meanings in the patent vernacular; that is, (i) “comprising,” which is synonymous with “including,” “containing,” or “characterized by,” is inclusive or open-ended and does not exclude additional, unrecited elements or method steps; (ii) “consisting of” excludes any element, step, or ingredient not specified in the claim; and (iii) “consisting essentially of” limits the scope of a claim to the specified materials or steps and those that do not materially affect the basic and novel characteristic(s) of the claimed invention. Embodiments described in terms of the phrase “comprising” (or its equivalents), also provide, as embodiments, those which are independently described in terms of “consisting of” and “consisting essentially of.” For those composition embodiments provided in terms of “consisting essentially of,” the basic and novel characteristic(s) of the nanocomposite is the incorporation of the Mxene compositions in the grain boundaries of the inorganic oxide or related inorganic oxide-type grains of the nanocomposite matrices.

When a list is presented, unless stated otherwise, it is to be understood that each individual element of that list, and every combination of that list, is a separate embodiment. For example, a list of embodiments presented as “A, B, or C” is to be interpreted as including the embodiments, “A,” “B,” “C,” “A or B,” “A or C,” “B or C,” or “A, B, or C.”

Throughout this specification, words are to be afforded their normal meaning, as would be understood by those skilled in the relevant art. However, so as to avoid misunderstanding, the meanings of certain terms will be specifically defined or clarified.

As described elsewhere herein, the term “inorganic oxides and oxide-type materials” refers to both inorganic oxides and inorganic oxycarbides, oxynitrides, and oxycarbonitrides. While inorganic oxides are the preferred embodiments within this description, where this term is used, each of inorganic oxides, inorganic oxycarbides, inorganic oxynitrides, and inorganic oxycarbonitride are deemed independent embodiments, as if separately and independently recited (allowing that any list provided may specifically exclude individual materials)

The term “cold sintering” or “cold sintering processing” refers to a process as described herein, as well as that described in U.S. Patent Application Publication No. US 2017/0088471, which is incorporated by reference herein in its entirety for all purposes, and at least for its descriptions of the principles and general teachings of the cold sintering process. As described in this reference, cold sintering comprises a process for preparing a sintered material, the process comprising combining at least one inorganic compound in particle form with a solvent that can partially solubilize the inorganic compound to form a mixture; and applying pressure and heat to the mixture to evaporate the solvent and densify the at least one inorganic compound to form the sintered material, wherein the applied heat is at a temperature of no more than 200° C. above the boiling point of the solvent. In the present context, the at least one inorganic compound comprises the inorganic oxides and oxide-type materials as well as the MXene materials. Typically, the applied pressure is no more than 5,000 MPa and the ceramic is sintered to a relative density of no less than 85%. Also, typically, the sintered material achieves a relative density of at least 85% in a time period of no more than 60 minutes of, additionally or alternatively, a relative density of at least 90% in a time period of no more than 30 minutes. In the context of the present disclosure, the solvent includes one or more of a $C_{1-12}$ alcohol, polyol, ketone, ester, or water, or an organic acid or mixtures thereof, wherein the solvent has a boiling point below 200° C.

The terms “homogeneous” and “homogeneously,” as in “homogeneously distributed” are to be interpreted in the conventional sense; i.e., uniform in structure or composition. In the context of the present disclosure, the term is intended to connote that the MXenes are distributed as a grain boundary additive network within the composite matrix. While practical considerations may give rise to local anomolies, the term is intended to distinguish those composition bodies where macroscale compositional gradients or discontinuities exist and so connote that such gradients or discontinuities do not exist. This does not preclude, however, those compositions comprising stacked or multiplexed individual compositions, each having different compositions comprising different MXenes or MXene concentrations.

The terms “MXenes” (or functional equivalents) or “two-dimensional (2D) crystalline transition metal carbides” or two-dimensional (2D) transition metal carbides" may be used interchangeably to refer collectively to compositions described herein as comprising substantially two-dimensional crystal lattices of the general formulae $M_{n+1}X_n(T_s)$, $M_2A_2X(T_s)$, and $M'_2M''_nX_{n+1}(T_s)$, where M, M', M", A, X, and $T_5$ are defined herein (noting the functional equivalence of $T_s$ and $T_x$). Supplementing the descriptions herein, $M_{n+1}X_n(T_s)$ (including $M'_2M''_mX_{m+1}(T_s)$ compositions) may be viewed as comprising free standing and stacked assemblies of two dimensional crystalline solids. Collectively, such compositions are referred to herein as "$M_{n+1}X_n(T_s)$," "MXene," "MXene compositions," or "MXene materials." Additionally, these terms "$M_{n+1}X_n(T_s)$," "MXene," "MXene compositions," or "MXene materials" can also independently refer to those compositions derived by the chemical exfoliation of MAX phase materials, whether these compositions are present as free-standing 2-dimensional or stacked assemblies or as incorporated into the nanocomposite structure. These compositions may be comprised of individual or a plurality of such layers. In some embodiments, the MXenes comprising stacked assemblies may be capable of, or have atoms, ions, or molecules, that are intercalated between at least some of the layers. In other embodiments, these atoms or ions are lithium.

The term "crystalline compositions comprising at least one layer having first and second surfaces, each layer comprising a substantially two-dimensional array of crystal cells" refers to the unique character of these materials. For purposes of visualization, the two-dimensional array of crystal cells may be viewed as an array of cells extending in an x-y plane, with the z-axis defining the thickness of the composition, without any restrictions as to the absolute orientation of that plane or axes. It is preferred that the at least one layer having first and second surfaces contain but a single two-dimensional array of crystal cells (that is, the z-dimension is defined by the dimension of approximately one crystal cell), such that the planar surfaces of said cell array defines the surface of the layer; it should be appreciated that real compositions may contain portions having more than single crystal cell thicknesses.

That is, as used herein, "a substantially two-dimensional array of crystal cells" refers to an array which preferably includes a lateral (in x-y dimension) array of crystals having a thickness of a single unit cell, such that the top and bottom surfaces of the array are either surface coated available for chemical modification or are bonded to the inorganic oxide grains as described elsewhere herein.

As used herein, the term "perovskite" is consistent with its well-known meaning in the art as refers to a crystal form having an array of metal and oxygen atoms as present in $CaTiO_3$, or more generally described in the present context in terms of $^{XII}A^{2+}\ ^{VI}B^{4+}O^{-}_3$ with the oxygen in the face centers. These include simple perovskites, such as barium, lead, or strontium titanate as well as complex perovskites, which include mixtures of simple perovskites, such as lead zirconate titanate or lead magnesium niobate. Perovskites also embrace optionally doped titanates, niobates, tantalates, nickelate, ruthenate, vanadate, and zirconate oxides As used herein, the term "perovskite-like" usually refers to an inorganic lattice structure having a number of interconnected oxygen octahedra. The layered perovskite-like materials can be classified under three general types:

(I) compounds having the formula $A_{m-1}Bi_2M_mO_{3m+3}$, where A=$Bi^{3+}$, $Ba^{2+}$, $Sr^{2+}$, $Ca^{2+}$, $Pb^{2+}$, $K^+$, $Na^+$ and other ions of comparable size, and M=$Ti^{4+}$, $Nb^{5+}$, $Ta^{5+}$, $M^{o6+}$. $W^{6+}$, $Fe^{3+}$ and other ions that occupy oxygen octahedra; this group includes bismuth titanate, $Bi_4Ti_3O_{12}$;

(II) compounds having the formula $A_{m+1}M_mO_{3m+1}$, including compounds such as strontium titanates or ruthenates, $Sn_2TiO_4$, $Sn_3Ti_2O_7$ and $Sr_4Ti_3O_{10}$ and $Sr_2RuO_4$; and (III) compounds having the formula $A_mM_mO_{3m+2}$, including compounds such as $Sr_2Nb_2O_7$, $La_2Ti_2O_7$, $Sr_2TiNb_4O_{17}$, and $Sr_6Ti_2Nb_4O_{20}$.

The following listing of Embodiments is intended to complement, rather than displace or supersede, the previous descriptions.

Embodiment 1

A nanocomposite comprising a co-sintered composition of a MXene composition and an inorganic oxide (or related inorganic material, such as an inorganic oxycarbide, oxynitride, oxycarbonitride).

Embodiment 2

The nanocomposite of Embodiment 1, comprising a co-sintered composition of the MXene composition and an inorganic binary, ternary, or quaternary oxide.

Embodiment 3

The nanocomposite of Embodiment 1 or 2, wherein the inorganic oxycarbide, oxynitride, oxycarbonitride, or oxide comprises one or more alkali metal (Group 1 of the Periodic Table; e.g., including lithium, sodium, potassium, rubidium, and cesium oxides), alkaline earth metal (Group 2 of the Periodic Table; e.g., Be, Mg, Ca, Sr, and Ba oxides), transition metal (comprising elements of Groups 3-12 of the Periodic Table), lanthanide and actinide metal, and/or metalloid (comprising elements of Groups 13-16 of the Periodic Table; e.g., Al, Ga, In, Sn, Bi, Sb, P, or Pb). In specific Aspects of this Embodiment, the inorganic oxycarbide, oxynitride, oxycarbonitride, or oxide comprises one or more oxide of Sc, Y, Ti, Zr, Hf, V, Nb, Ta, Cr, Mo, W, Mn, Re, Fe, Ru, Os, Co, Rh, Ir, Ni, Pd, Pt, Cu, Ag, Au, Zn, Cd, Al, Ga, In, Ge, Sn, Pb, Bi, or a combination thereof. It is to be appreciated that each of these individual oxides or combination of oxides represent independent Aspects of this Embodiment and should be interpreted every bit as much as if each had been listed individually or in individual combinations.

Embodiment 4

The nanocomposite of any one of Embodiments 1 to 3, comprising one or more oxide of In, Ti, Sn, Zn, Zr, or a combination thereof. Independent Aspects of this Embodiment include those articles or devices comprising these compositions.

Embodiment 5

The nanocomposite of any one of Embodiments 1 to 4, comprising one or more oxide of Co, Mn, Nb, Pb, Ta, Ti, W, Zn, and Zr. Independent Aspects of this Embodiment include those articles or devices comprising these compositions. For example, certain such devices include capacitors.

In certain Aspects thereof, the nanocomposites may also include oxides of Ba, K, Mg, Na, and Sr. Additionally, or alternatively, the nanocomposites may comprise compositions exhibiting ferroelectric behavior. In certain Aspects thereof, the nanocomposites may also include oxides of barium and/or lead, such that the oxides comprise barium titanate, lead titanate, lead zirconate, lead titanate/zirconate, or lead magnesium niobate. In certain Aspects of this embodiment, the nanocomposites may comprise compositions that exhibit antiferroelectric, ferroelastic, ferroelectric, ferromagnetic, flexoelectric, paraelectric, piezoelectric, and/or pyroelectric behavior. In certain Aspects of this Embodiment, the nanocomposites may independently comprise lead or be lead-free. In certain Aspects of this Embodiment, the nanocomposites independently comprise barium titanate ($BaTiO_3$), lead zirconate titanate ($Pb[Zr_xTi_{1-x}]O_3$ with $0 \leq x \leq 1$), potassium niobate ($KNbO_3$), sodium tungstate ($Na_2WO_3$), $Ba_2NaNb_5O_5$, $Pb_2KNb_5O_{15}$, zinc oxide (ZnO) (cubic or hexagonal, especially hexagonal Wurtzite), sodium potassium niobate ($(K,Na)NbO_3$) (also known as NKN or KNN), bismuth ferrite ($BiFeO_3$), sodium niobate ($NaNbO_3$), barium titanate ($BaTiO_3$), bismuth titanate ($Bi_3Ti_3O_{12}$), and/or sodium bismuth titanate ($NaBi(TiO_3)_{2)]}$)

Embodiment 6

The nanocomposite of any one of Embodiments 1 to 5, wherein the inorganic oxycarbide, oxynitride, or oxide is or comprises a ferrite, a nickelate, a niobate, a ruthenate, a tantalate, a titanate, a tungstate, a vanadate, a zirconate, or a combination or mixture thereof. In certain independent Aspects of this Embodiment, these materials are optionally doped with other oxide materials.

Embodiment 7

The nanocomposite of any one of Embodiments 1 to 6, comprising ZnO. Again, as such materials are useful as semiconductors and in varistors, thermoelectrics, optoelectronics, piezoelectric transducers, photocatalysts, and gas sensors. In certain Aspects of this Embodiment include those devices configured to provide these properties comprising these nanocomposites.

Embodiment 8

The nanocomposite of any one of Embodiments 1 to 7, further comprising one or more lanthanide metal oxide. These lanthanide metal oxides include, as independent Aspects of this Embodiment, one or more of Y, La, Ce, Pr, Nd, Pm, Sm, Eu, Gd, Tb, Dy, Ho, Er, Tm, Yb, or Lu. And again, these individual oxides or combination of oxides represent independent Aspects of this Embodiment and should be interpreted every bit as much as if each had been listed individually or in individual combinations.

Embodiment 9

The nanocomposite of any one of Embodiments 1 to 8, wherein the inorganic oxide (or related inorganic oxycarbide, oxynitride, or oxycarbonitride) has a perovskite structure.

Embodiment 10

The nanocomposite of any one of Embodiments 1 to 9, wherein the MXene composition comprises at least one layer having first and second surfaces, each layer described by a formula $M_{n+1}X_nT_x$ and comprising:

a substantially two-dimensional array of crystal cells, each crystal cell having an empirical formula of $M_{n+1}X_n$, such that each X is positioned within an octahedral array of M, wherein M is at least one Group IIIB, IVB, VB, or VIB metal, wherein each X is C, N, or a combination thereof;

n=1, 2, or 3; and wherein $T_x$ represents surface termination groups.

In certain Aspects of this Embodiment, X is C. In other independent Aspects, X is N.

Embodiment 11

The nanocomposite of Embodiment 10, wherein the empirical formula of the $M_{n+1}X_n$ MXene composition comprises $Sc_2C$, $Ti_2C$, $V_2C$, $Cr_2C$, $Cr_2N$, $Zr_2C$, $Nb_2C$, $Hf_2C$, $Ti_3C_2$, $V_3C_2$, $Ta_3C_2$, $Ti_4C_3$, $V_4C_3$, $Ta_4C_3$, $Sc_2N$, $Ti_2N$, $V_2N$, $Cr_2N$, $Cr_2N$, $Zr_2N$, $Nb_2N$, $Hf_2C$, $Ti_3N_2$, $V_3C_2$, $Ta_3C_2$, $Ti_4N_3$, $V_4C_3$, $Ta_4N_3$ or a combination or mixture thereof, preferably $Ti_3C_2$ or $Ti_2C$.

Embodiment 12

The nanocomposite of any one of Embodiments 1 to 11, wherein the MXene composition comprises a substantially two-dimensional array of crystal cells having an empirical formula of $Ti_3C_2T_x$.

Embodiment 13

The nanocomposite of any one of Embodiments 1 to 9, wherein the MXene composition at least one layer having first and second surfaces, each layer described by a formula $M'_2M''_nX_{n+1}T_x$ and comprising:

a substantially two-dimensional array of crystal cells, each crystal cell having an empirical formula of $M'_2M''_nX_{n+1}$, such that each X is positioned within an octahedral array of M' and M", and where $M''_n$ are present as individual two-dimensional array of atoms intercalated (sandwiched) between a pair of two-dimensional arrays of M' atoms, wherein M' and M" are different Group IIIB, IVB, VB, or VIB metals (especially where M' and M" are Ti, V, Nb, Ta, Cr, Mo, or a combination thereof), wherein each X is C, N, or a combination thereof; and n=1 or 2; and wherein $T_x$ represents surface termination groups.

In certain Aspects of this Embodiment, X is C. in other independent Aspects, X is N.

Embodiment 14

The nanocomposite of Embodiment 13, wherein the empirical formula of the $M'_2M''_nX_{n+1}$, MXene composition comprises $Mo_2TiC_2$, $Mo_2VC_2$, $Mo_2TaC_2$, $Mo_2NbC_2$, $Mo_2Ti_2C_3$, $Cr_2TiC_2$, $Cr_2VC_2$, $Cr_2TaC_2$, $Cr_2NbC_2$, $Ti_2NbC_2$, $Ti_2TaC_2$, $V_2TaC_2$, or $V_2TiC_2$, preferably $Mo_2TiC_2$, $Mo_2VC_2$, $Mo_2TaC_2$, or $Mo_2NbC_2$, or their nitride or carbonitride analogs or $Mo_2Ti_2C_3$, $Mo_2V_2C_3$, $Mo_2Nb_2C_3$, $Mo_2Ta_2C_3$, $Cr_2Ti_2C_3$, $Cr_2V_2C_3$, $Cr_2Nb_2C_3$, $Cr_2Ta_2C_3$, $Nb_2Ta_2C_3$, $Ti_2Nb_2C_3$, $Ti_2Ta_2C_3$, $V_2Ta_2C_3$, $V_2Nb_2C_3$, or $V_2Ti_2C_3$, preferably $Mo_2Ti_2C_3$, $Mo_2V_2C_3$, $Mo_2Nb_2C_3$, $Mo_2Ta_2C_3$, $Ti_2Nb_2C_3$, $Ti_2Ta_2C_3$, or $V_2Ta_2C_3$, or their nitride or carbonitride analogs.

It is to be appreciated that Embodiments 10 to 14 include those Aspects where the MXene composition is any of the compositions described in any one of U.S. patents application Ser. Nos. 14/094,966 (filed Dec. 3, 2013), 62/055,155 (filed Sep. 25, 2014), 62/214,380 (filed Sep. 4, 2015), 62/149,890 (filed Apr. 20, 2015), 62/127,907 (filed Mar. 4, 2015) or International Applications PCT/US2012/043273 (filed Jun. 20, 2012), PCT/US2013/072733 (filed Dec. 3, 2013), PCT/US2015/051588 (filed Sep. 23, 2015), PCT/US2016/020216 (filed Mar. 1, 2016), or PCT/US2016/028,354 (filed Apr. 20, 2016), each of which is incorporated by reference at least for its teaching of the compositions and methods of making the same.

Embodiment 15

The nanocomposite of any one of Embodiments 1 to 14, wherein the inorganic oxide (or related inorganic oxycarbide, oxynitride, or oxycarbonitride) thereof are present as grains within the nanocomposite, the grains having dimensions in a range of from 100 nm to 200 nm, 200 nm to 300 nm, 300 nm to 400 nm, 400 nm to 500 nm, 500 nm to 600 nm, 600 nm to 700 nm, 700 nm to 800 nm, 800 nm to 900 nm, or any combination of two or more of the foregoing ranges, for example from 200 nm to 600 nm.

Embodiment 16

The nanocomposite of any one of Embodiments 1 to 15, wherein the nanocomposite exhibits a density greater than 80%, greater than 85%, greater than 90%, greater than 92%, greater than 94%, greater than 96% to about 98% of the theoretical density of the nanocomposite; i.e., of the inorganic oxide (or related inorganic oxycarbide, oxynitride, or oxycarbonitride) within the nanocomposite.

Embodiment 17

The nanocomposite of any one of Embodiments 1 to 16, wherein the MXene composition is distributed along the grain boundaries of the sintered nanocomposite.

Embodiment 18

The nanocomposite of any one of Embodiments 1 to 17, wherein the MXene composition is distributed substantially homogeneously throughout the nanocomposite.

Embodiment 19

The nanocomposite of any one of Embodiments 1 to 18, wherein the nanocomposite exhibits hardness and/or elastic modulus that is at least 10%, 20%, 30%, 40%, or 50% to about 500% greater than an otherwise equivalent nanocomposite not containing the MXene composition or prepared under otherwise equivalent conditions in the absence of the MXene composition. Additionally, or alternatively, in certain Aspects of this Embodiment, the nanocomposite exhibits semi-conductive behavior. Additionally, or alternatively, in certain Aspects of this Embodiment, the nanocomposite is electrically conductive.

Embodiment 20

The nanocomposite of any one of Embodiments 1 to 19 the nanocomposite exhibits an electric conductivity that is at least 10%, 20%, 30%, 40%, 50%, 100%, 250%, 500% greater to about 1, 2, or 3 orders of magnitude greater than an otherwise equivalent nanocomposite not containing the MXene composition or prepared under otherwise equivalent conditions in the absence of the MXene composition. In certain Aspects of this Embodiment, the nanocomposite exhibits semi-conductive behavior. In certain Aspects of this Embodiment, the nanocomposite exhibits metallic conductivity. In certain Aspects of this Embodiment, the nanocomposite can function as a non-conductive dielectric. In separate Aspects of this Embodiment, the nanocomposites comprising ZnO and $Ti_3C_2$ exhibit at least the same properties as described in the Example, as attributable to the components of those ZnO—$Ti_3C_2Ti_x$ nanocomposites.

Embodiment 21

The nanocomposite of any one of Embodiments 1 to 19, wherein the MXene composition is present in an amount of about 1%, 2%, 3%, 4%, 5%, 6%, 7%, 8%, 9%, 10%, 15%, 20%, or 25% by weight relative to the weight of the entire composition.

Embodiment 22

The nanocomposite of any one of Embodiments 1 to 21, prepared by cold sintering.

Embodiment 23

The nanocomposite of any one of Embodiments 1 to 22, prepared by sintering the component materials at a temperature of 750° C. or less, 500° C. or less, preferably 400° C. or less, more preferably 300° C. or less.

Embodiment 24

A method of preparing the nanocomposite of any one of Embodiments 1 to 23 comprising:

(a) distributing the MXene composition and the oxide (or related inorganic oxycarbide, oxynitride, or oxycarbonitride) thereof into a homogeneous mixture;

(b) compacting the mixture into a compact form; and (c) cold sintering the compact form at a temperature of 500° C. or less, preferably 400° C. or less, more preferably 300° C. or less for a period of time to form the nanocomposite comprising the co-sintered composition of a MXene composition and the oxide (or related inorganic oxycarbide, oxynitride, or oxycarbonitride).

In certain Aspects of this Embodiment, the resulting nanocomposite exhibits one or more of the properties described as attributable to these nanocomposites.

Alternatively or additionally, in certain Aspects of this Embodiment, the cold sintering process comprises one or more of the following features:

a process for preparing a sintered material, the process comprising combining at least one inorganic compound in particle form having a particle size of less than 50 p,m with a solvent that can partially solubilize the inorganic compound to form a mixture; and applying pressure and heat to the mixture to evaporate the solvent and densify the at least one inorganic compound to form the sintered material, wherein the applied heat is at a temperature of no more than 200° C. above the boiling point of the solvent.

the process further comprising combining the at least one inorganic compound in particle form and at least one other substance with a solvent that can partially solubilize the inorganic compound to form a mixture; and applying pressure and heat to the mixture to evaporate the solvent and densify the at least one inorganic compound to form the composite, wherein the applied heat is at a temperature of no more than 200° C. above the boiling point of the solvent.

a process wherein the solvent includes one or more source compounds.

a process comprising depositing a ceramic on a substrate followed by exposing the deposited ceramic to a liquid (preferably aqueous) solvent to form a wetted deposited ceramic and applying pressure and heat to the wetted deposited ceramic to sinter the ceramic on the substrate, wherein the applied heat is no more than 200° C., the applied pressure is no more than 5,000 MPa and the ceramic is sintered to a relative density of no less than 85%.

a process wherein the sintered material achieves a relative density of at least 85% in a time period of no more than 60 minutes.

a process wherein the sintered material or composite achieves a relative density of at least 90% in a time period of no more than 30 minutes.

a process wherein the solvent includes one or more of a $C_{1-12}$ alcohol or polyol (including, e.g., methanol, ethanol, propanol, isopropanol, butanol, 1,2-ethanediol, glycerol, etc.), $C_{1-12}$ amine, $C_{1-12}$ ketone, $C_{1-12}$ ester, or water, or a $C_{1-12}$ organic acid (including acetic acid or propionic acid) or molecular mixtures (e.g., hydroxycarboxylic acids, hydroxyamines, hydroxycarboxylic acids, or amino acids) or physical mixtures thereof wherein the solvent has a boiling point below 200° C.

a process wherein the solvent includes at least 50% by weight of water.

a process wherein the inorganic compound or ceramic and the solvent are combined by exposing the inorganic compound or ceramic to a controlled relative atmosphere of the solvent.

a process wherein the applied heat is at a temperature no more than 250° C.

a process wherein the pressure is no more than about 5,000 MPa.

a process wherein the relative density of the sintered material or composite is greater than 90%.

a process wherein the at least one inorganic compound or ceramic has a particle size of less than 30 μm.

a process further comprising milling the at least one inorganic compound or ceramic prior to forming the mixture.

a process further comprising forming the mixture on two or more substrates and laminating the two or more substrates with the sintered inorganic compound or composite.

a process wherein wherein the inorganic compound or ceramic and the solvent are combined by exposing the inorganic compound or ceramic to a controlled relative atmosphere of the solvent.

Embodiment 25

The method of Embodiment 24, wherein the cold sintering also involves pressure-assisted transient liquid phase sintering, where the liquid (preferably aqueous) undergoes evaporation during sintering. In certain Aspects of this Embodiment, the homogeneous mixture compacted into the compact form contains a carboxylic acid, such as acetic acid.

Embodiment 26

The method of Embodiment 24 or 25, wherein the compacting is done at a pressure in a range of from 50 MPa to 100 MPa, from 100 MPa to 150 MPa, from 150 MPa to 200 MPa, from 200 MPa to 225 MPa, from 225 MPa to 250 MPa, from 250 MPa to 275 MPa, from 275 MPa to 300 MPa, from 300 MPa to 325 MPa, from 325 MPa to 350 MPa, from 350 MPa to 400 MPa, from 400 MPa to 450 MPa, from 450 MPa to 500 MPa, from 500 MPa to 600 MPa, or a combination of two or more of the foregoing ranges, for example, from 225 MPa to 275 MPa.

Embodiment 27

The method of any one of Embodiments 24 to 26, further comprising heat treating the nanocomposite comprising the co-sintered composition of a MXene composition and the inorganic oxide (or related inorganic oxycarbide, oxynitride, or oxycarbonitride) at a temperature in a range of from 350° C. to 400° C., from 400° C. to 450° C., from 450° C. to 500° C., from 500° C. to 550° C., from 550° C. to 600° C., from 600° C. to 650° C., from 650° C. to 700° C., from 700° C. to 750° C., from 750° C. to 800° C., from 800° C. to 850° C. to 900° C., from 900° C. to 950° C., from 950° C. to about 1000° C., or in a ranged defined by two or more of the foregoing ranges, for example from 700° C. to 900° C.

EXAMPLES

The Examples are provided to illustrate some of the concepts described within this disclosure. While each Example is considered to provide specific individual embodiments of composition, methods of preparation and use, none of the Examples should be considered to limit the more general embodiments described herein. In particular, while the examples provided here focus on specific metallic oxides and MXene materials, it is believed that the principles described are relevant to other such oxides and MXene materials. Accordingly, the descriptions provided here should not be construed to limit the disclosure, and the reader is advised to look to the nature of the claims as a broader description.

In the following examples, efforts have been made to ensure accuracy with respect to numbers used (e.g. amounts, temperature, etc.) but some experimental error and deviation should be accounted for. Unless indicated otherwise, temperature is in degrees C., pressure is at or near atmospheric.

Example 1

Experimental Section

Example 1.1

Powder Preparation: ZnO powder (99.9%, Alfa Aesar) was used as the oxide matrix. The $Ti_3C_2T_x$ was produced by adding $Ti_3AlC_2$ powder into a 7.5M LiF-6.0M HCl solution maintaining the molar ratio of LiF to MAX equal to 7.5:1. After the $Ti_3AlC_2$ was slowly added to the acid solution, the temperature was brought to 35° C. for 24 h. The resulting MXene slurry was repeatedly washed with DI water until a pH≥6. Vacuum-assisted filtration was used to collect the MXene. It was then dried in a vacuum desiccator at room temperature for 24 h. Delamination was performed through sonication of the MXene in DI water for 1 h under Argon. The MXene solution was repeatedly centrifuged at 3500 rpm for 1 hour and the colloidal supernatant collected. MXene was verified via size distribution, SEM, UV-Vis, and Raman. MXene distribution was mixed and sonicated with the ZnO for 15 minutes based on the composition (1-y) ZnO-y $Ti_3C_2T_x$ (x=0.5, 1, 3, 5 wt %). The mixture was then manually agitated, immediately flash frozen and freeze-dried for 72 hours.

Example 1.2

Cold Sintering of ZnO-MXene composites: The (1-y) ZnO-y $Ti_3C_2T_x$ powders were mixed with 17-20 wt % 1.5 M acetic acid using a pipette in a fume hood. Specifically, 0.2-0.25 g 1.5 M acetic acid was added into 1 g (1-y)ZnO-y$Ti_3C_2T_x$ powders and homogenized with a pestle and mortar in several minutes. The wetted powders were placed in a steel die with a diameter of 12.7 mm and pressed under a uniaxial pressure of 250 MPa. Then, the die under the pressure condition was heated up to 300° C. with a ramp of 5-6° C./min and held at 300° C. for 1 h. Afterwards, the die was cooled down in air and the samples were taken out after the temperature was lower than 80° C.

Example 1.3

Characterization: The densities of (1-y)ZnO-y$Ti_3C_2T_x$ nanocomposites cold sintered at 300° C. under a pressure of 250 MPa were determined by Archimedes method (ethanol as the medium) and verified by geometry method. The X-ray diffraction (XRD) data was collected using the PANalytical Empyrean system. The XRD system was operated at 45 kV and 40 mA using a step size of 0.026° with Cu Kα radiation and fixed incident slit of 0.5°.

The grain morphology, grain size and grain boundary were observed with a field emission scanning electron microscope (FESEM, FEI, NanoSEM 630) and a high-resolution transmission electron microscope (TEM, FEI, $Titan_3$ @ 200 kV). TEM specimens were polished by a Focused Ion Beam (FIB, FEI, Helios NanoLab 660). Prior to FIB milling, a protective carbon layer was deposited over the region of interest by electron beam. After the specimen become electron transparent, the final cleaning was applied to both sample surfaces by using 1 kV ion beam to remove the damage layer during the FIB milling. The energy dispersive spectroscopy (EDS) mapping were performed by using a SuperX EDS system, which has four silicon drift detectors surrounding the sample, under scanning transmission electron microscopy (STEM) mode by using a high angle annular dark field (HAADF) detector. Before the electrical characterization, the cold sintered samples were cut into bars with a dimension of (8–10)×2×1 mm and polished. The temperature dependent electrical conductivity and Seebeck coefficients were collected using LSR-3 system (LINSEIS Messgeräte GmbH) with a He atmosphere and a pressure of 1 bar. The Seebeck coefficients were calculated using the slope of Seebeck voltage (ΔV) and temperature gradient (ΔT). The thermoelectric power factor (PF) was calculated as follows: $PF=S_{2\sigma}$. Before the mechanical characterization, the cold sintered samples were polished with sandpaper (600, 800, and 1200 grit), $Al_2O_3$ polishing powder (6 μm, 3 μm, 1 μm, 0.5 μm and 0.05 μm), and ion-mill in turn. The indentation load vs depth curves were obtained by the Nanoindenter (Hysitron TI-980 TriboIndenter) using XPM (Accelerated Property Mapping) with a 10 mN load at room temperature. The hardness and elastic modulus were determined from the load-depth curves and the average data were calculated from 20-25 indentations.

Example 2

Results and Discussions

In the present experiments, ZnO was chosen as a suitable exemplary inorganic oxide material as it represented and represents a good candidate in thermoelectric energy conversion. ZnO shows advantages of abundance, low cost, non-toxicity, and thermal stability for such applications, but its low electrical conductivity has limited its application.

Figure 2:
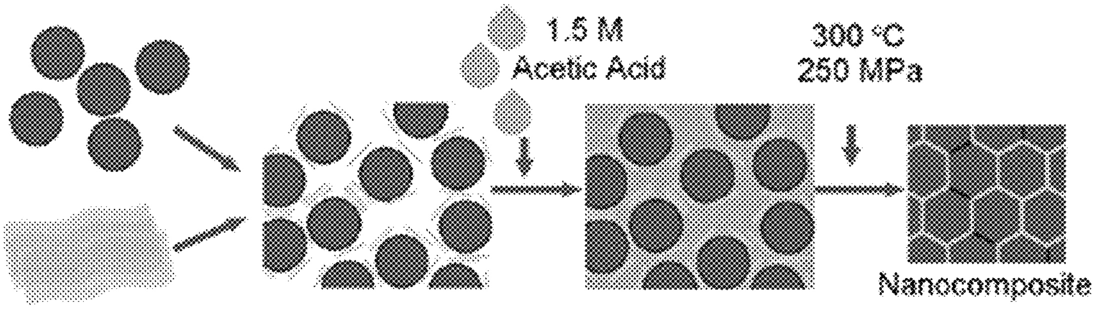
FIG. 2 provides a schematic illustration of one exemplary method for making $(1-y)ZnO$-$yTi_3C_2T_x$ nanocomposites via cold sintering

As is shown herein, the incorporation of 2D MXene dispersed along grain boundaries of ZnO, such as illustrated in FIG. 1, it was possible to improve both its electrical conductivity mechanical properties. The results described herein that demonstrated that cold co-sintering of ZnO with $Ti_3C_2T_x$ in air, as representative of ceramics, especially ceramic oxides and MXenes generally, to form ZnO—$Ti_3C_2T_x$ nanocomposites, more generally demonstrated the feasibility of cold sintering processing (CSP) as an effective fabrication method to develop functional ceramic-matrix nanocomposites, especially using MXene materials. The results described herein are believed to be the first report of a 2D material being densified into a ceramic without altering its structure or chemical functionalization without the need for high-energy, costly processing conditions. The fabrication method of dense ZnO—$Ti_3C_2T_x$ nanocomposites is shown schematically in FIG. 2.

As described elsewhere herein, to obtain a homogeneous dispersion of MXene, the prepared MXene solution was mixed and sonicated with ZnO, and then flash frozen and freeze-dried for 72 hours. Afterwards, 17-20 wt % 1.5 M acetic acid was added into the ZnO—$Ti_3C_2T_x$ mixture and homogenized. Finally, the wetted ZnO—$Ti_3C_2T_x$ powders were pressed in a die under a pressure of 250 MPa at a temperature of 300° C. for 1 hour.

Figure 3:
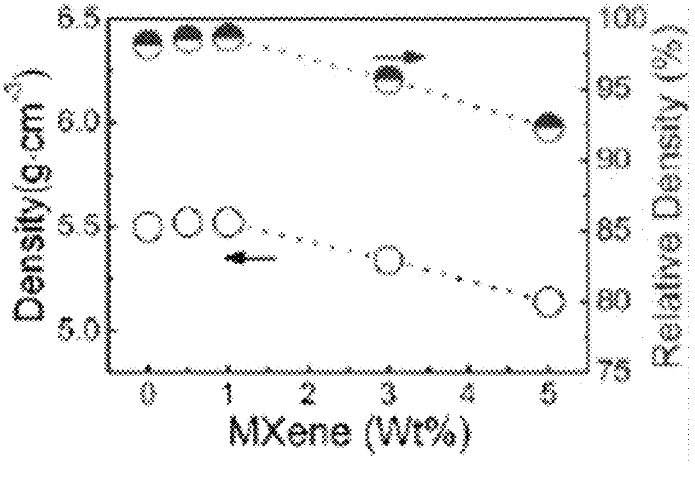
FIG. 3 shows density data of various Zn—$Ti_3C_2T_x$ nanocomposites cold sintered at 300° C. for 1 hour.
Figure 4:
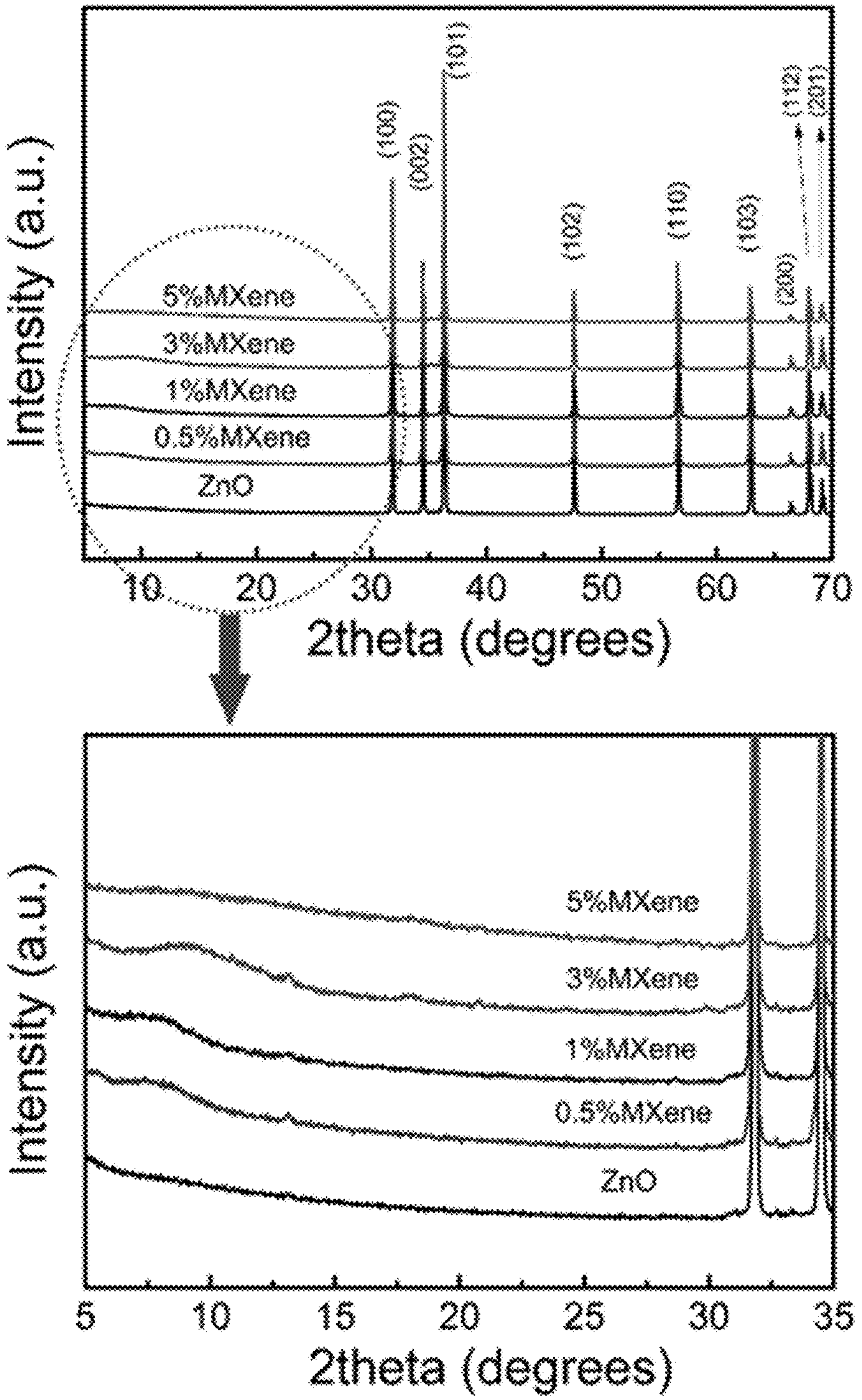
FIG. 4 provides XRD patterns of various Zn—$Ti_3C_2T_x$ nanocomposites cold sintered at 300° C. under a pressure of 250 MPa with the assist of 1.5 M acetic acid.
Figure 5A:
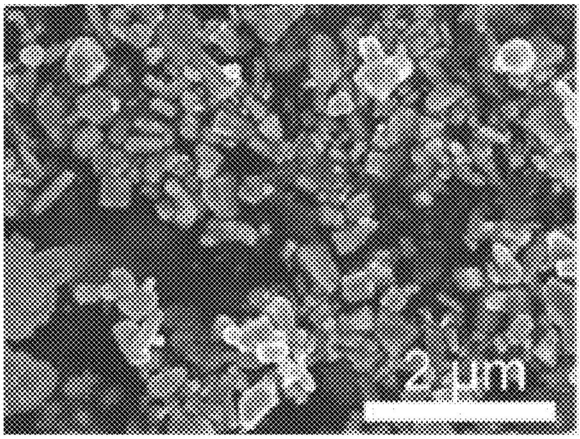
FIGS. 5(A-D) shows SEM micrographs of ZnO (FIG. 5(A)) and 99ZnO-1$Ti_3C_2T_x$ (FIG. 5(B)) raw powders and the cross sections of cold sintered ZnO (FIG. 5(C)) and 99ZnO-1$Ti_3C_2$ (FIG. 5(D)) ceramics.
Figure 5B:
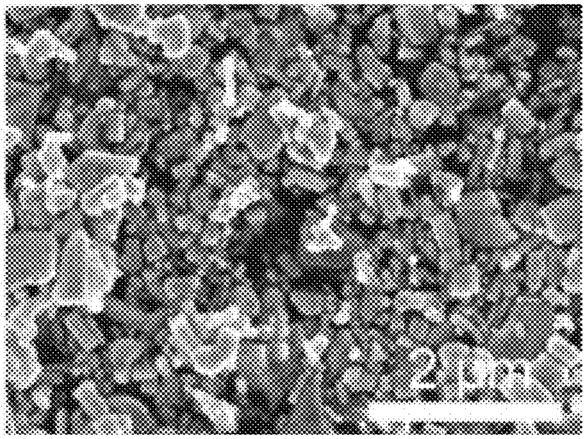
Figure 5C:
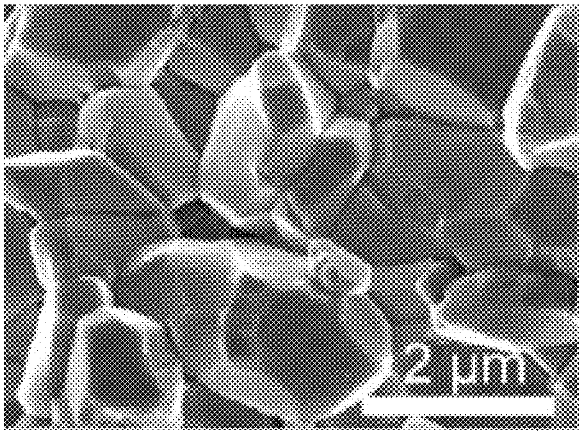
Figure 5D:
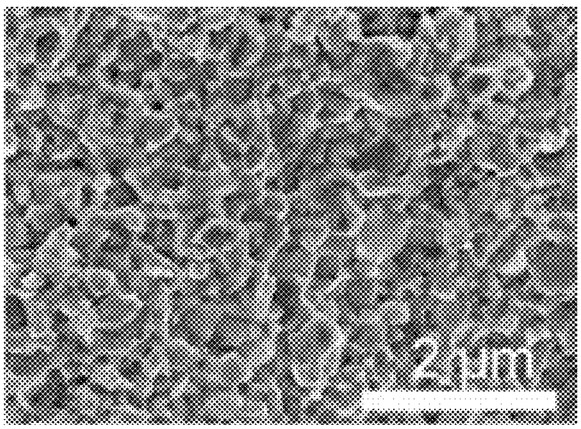

The relative densities of cold sintered (1-y)ZnO-y$Ti_3C_2T_x$ composites (y=0, 0.5, 1, 3, 5 wt %) were all higher than 90%, as shown in FIG. 3, demonstrating the general promise of using cold sintering process for sintering composite materials with MXenes. The XRD peaks of ZnO could be indexed to a wurtzite/zincite structure with the space group of $P6_3mc$, and the MXene showed a broad (002) peak in the range of 8° and 9° due to some multilayer flakes (FIG. 4), indicating that there was no reaction between ZnO and $Ti_3C_2T_x$ under the cold sintering condition. FIGS. 5(A-D) presents the SEM images of powders and cold sintered samples of ZnO and 99ZnO-1$Ti_3C_2T_x$. In the case of cold sintered ZnO at 300° C. for 1 h, the grains grew from nanometers (100-900 nm) to micrometers (1-4 μm), as shown in FIGS. 5(A and C). In contrast, the grain growth of ZnO was suppressed in the cold sintered 99ZnO-1$Ti_3C_2T_x$ composites, as shown in FIGS. 5(B and D). The $Ti_3C_2T_x$ located at the grain boundaries of ZnO minimized the coarsening of ZnO, but did not prevent the densification, as seen under the CSP conditions, and thus ZnO—$Ti_3C_2T_x$ nanocomposites could be obtained by CSP. It was also seen that the cold sintered ZnO and 99ZnO-1$Ti_3C_2T_x$ had highly compacted grain structure with a low porosity, in agreement with the measured density data.

Figure 6A:
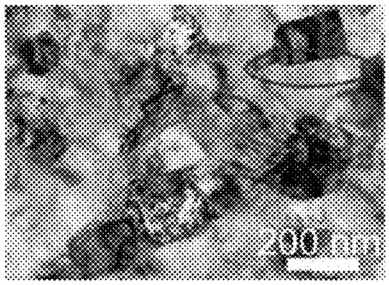
FIGS. 6(A-G) show TEM (FIGS. 6(A-C)), HAADF-STEM (FIG. 6(D)), and energy dispersive spectroscopy (EDS) elemental maps (FIGS. 6(E-G)) of cold sintered 99ZnO-1$Ti_3C_2T_x$ nanocomposite. The [red] circles in TEM and HAADF-STEM images show one example of the $Ti_3C_2T_x$ region. In HAADF image, bright areas belong to ZnO and dark areas belong to $Ti_3C_2T_x$. EDS maps, where elemental Zn is shown in red and Ti is shown in cyan, shows the presence of $Ti_3C_2T_x$ at the ZnO grain boundaries.
Figure 6B:
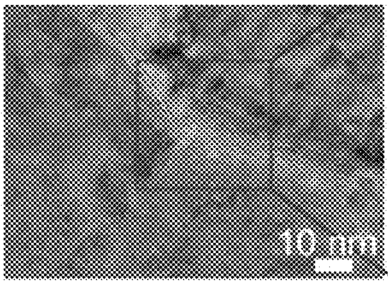
Figure 6C:
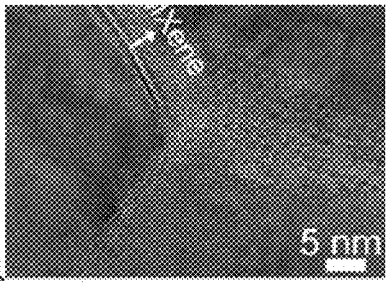
Figure 6D:
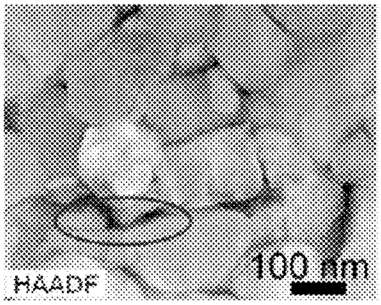
Figure 6E:
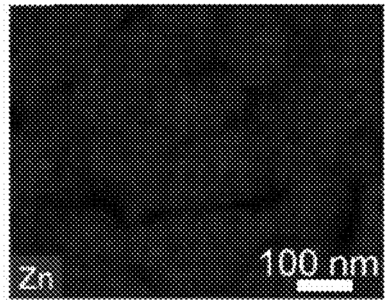
Figure 6F:
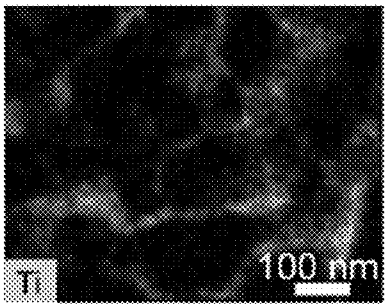
Figure 6G:
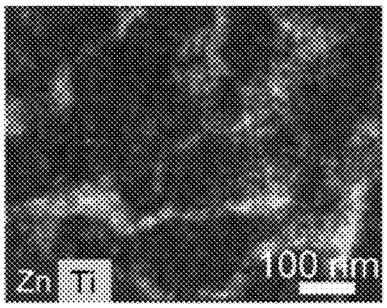
Figure 7:
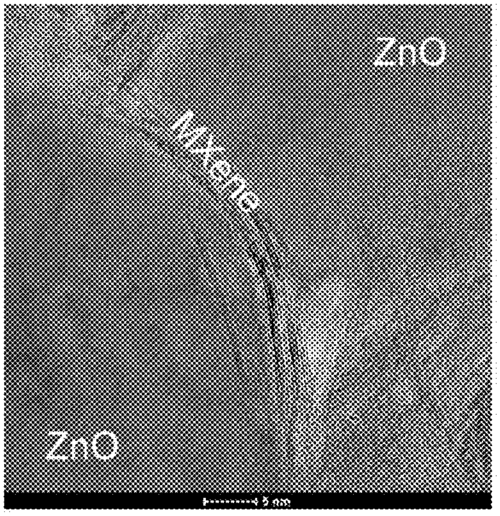
FIG. 7 is TEM image of a cold sintered 99ZnO-1$Ti_3C_2T_x$ nanocomposite.
Figure 8A:
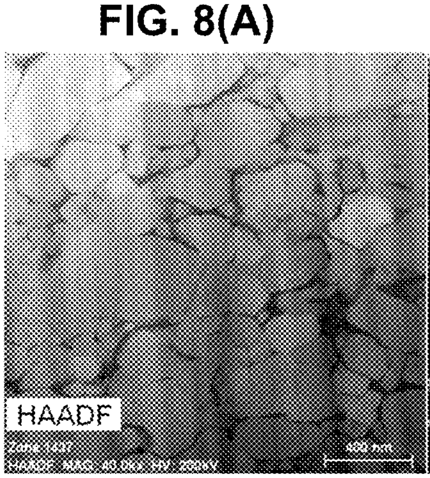
FIGS. 8(A-D) provide HAADF-STEM images and the EDS elemental maps of cold sintered 99ZnO-1$Ti_3C_2$ nanocomposite.
Figure 8B:
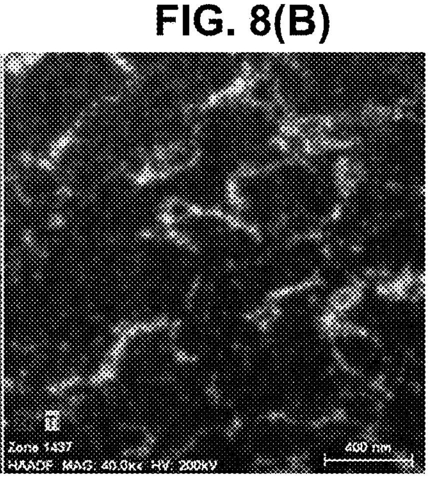
Figure 8C:
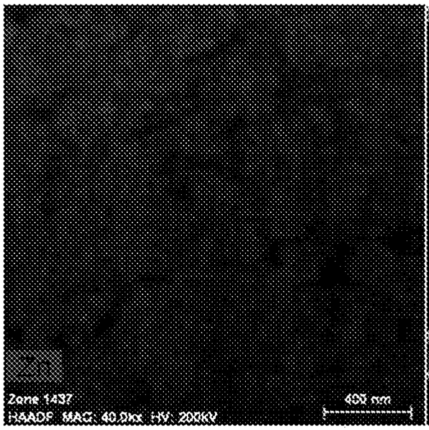
Figure 8D:
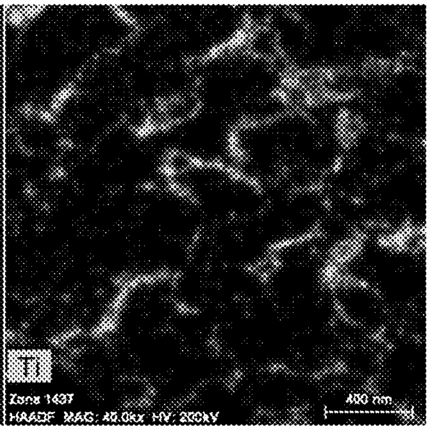

To further study the detailed microstructures of cold sintered (1−y)ZnO-y$Ti_3C_2T_x$ nanocomposites, high resolution TEM and STEM EDS mapping were employed, as shown in FIG. 6(A), FIG. 7 and FIG. 6. FIG. 6(A) presents the microstructural overview of cold sintered 99ZnO-1$Ti_3C_2T_x$ nanocomposite. As shown therein, the $Ti_3C_2T_x$ nanosheets were distributed around ZnO grains, which is further confirmed in the images with a higher magnification shown in FIGS. 6(B-C) and FIG. 7, where several $Ti_3C_2T_x$ nanosheets with a thickness of a few nanometers were found in the grain boundaries. Another proof of the distribution of $Ti_3C_2T_x$ was found in the STEM EDS mapping shown in FIGS. 6(D-G) and FIG. 8, where a homogeneous dispersion of $Ti_3C_2T_x$ was observed in the 99ZnO-1$Ti_3C_2T_x$ nanocomposites cold sintered at 300° C. Sintering of pure ZnO led to formation of micron-size grains even at 300° C. However, in the case of ZnO—$Ti_3C_2T_x$ composites, the 2D $Ti_3C_2T_x$ nanosheets, located at the grain boundaries of ZnO, unexpectedly inhibited the final grain growth of ZnO, and thus, ZnO—$Ti_3C_2T_x$ nanocomposites were obtained by CSP at 300° C. for 1 h.

Figure 9A:
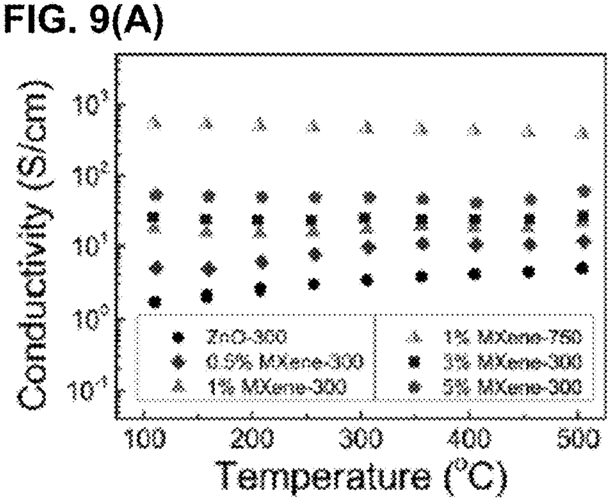
FIGS. 9(A-C) show the temperature dependent electrical conductivities (FIG. 9(A)), Seebeck coefficients (FIG. 9(B)), and power factors (FIG. 9(C)) of ZnO—$Ti_3C_2$ nanocomposites cold sintered at 300° C. for 1 hour. 300: Heat treatment in inert atmosphere at 300° C. 750: Heat treatment in inert atmosphere at 750° C. All the figures share the same legend.
Figure 9B:
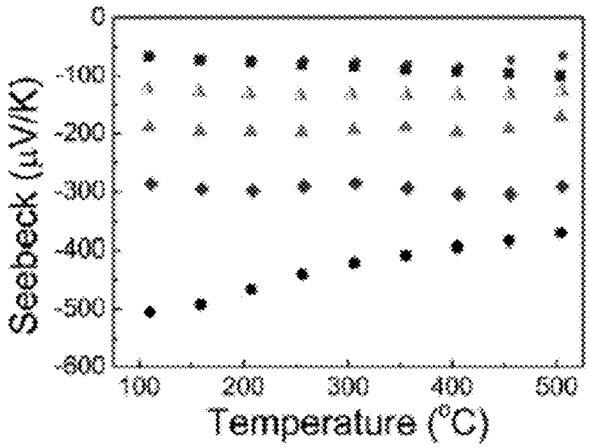
Figure 9C:
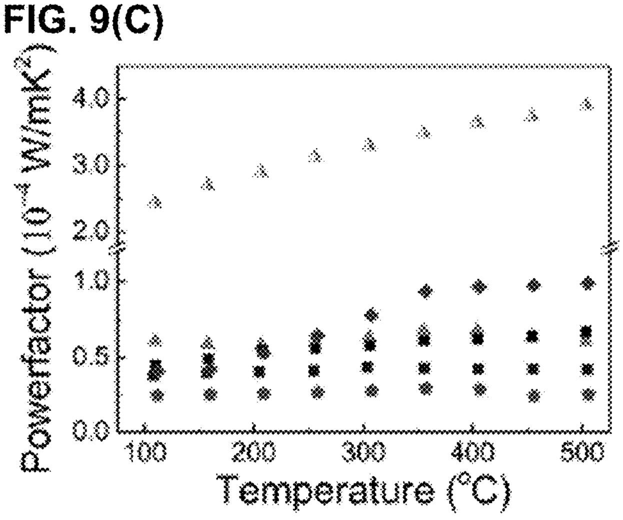
Figure 10A:
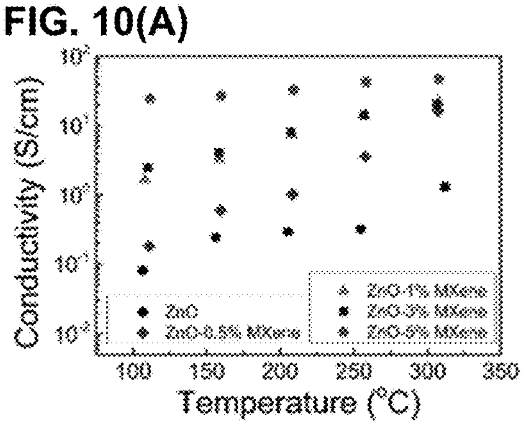
FIGS. 10(A-F) provides the temperature dependent electrical conductivities, Seebeck coefficients, and power factors of ZnO—$Ti_3C_2T_x$ nanocomposites cold sintered at 300° C. for 1 hour without (FIGS. 10(A-C)) and with heat treatment at 750° C.
Figure 10B:
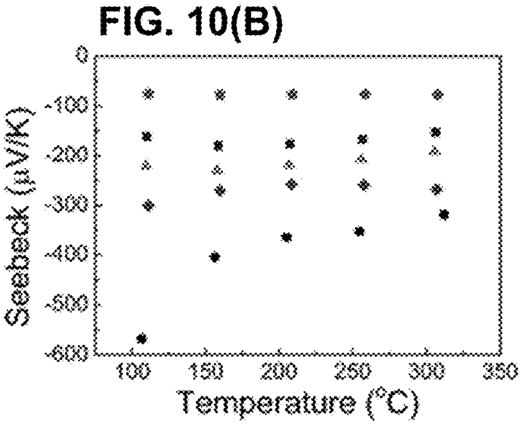
Figure 10C:
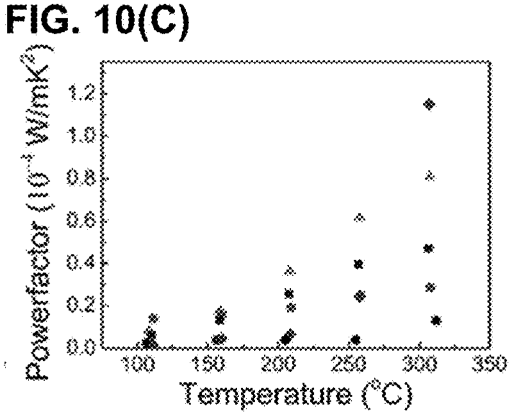
Figure 10D:
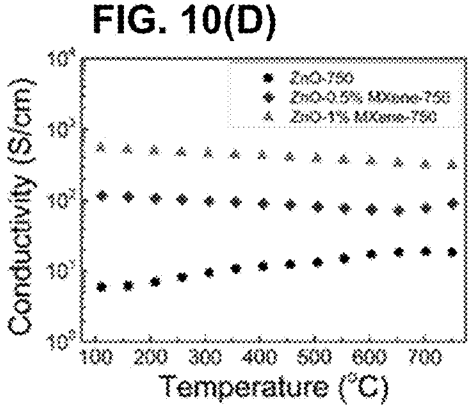
Figure 10E:
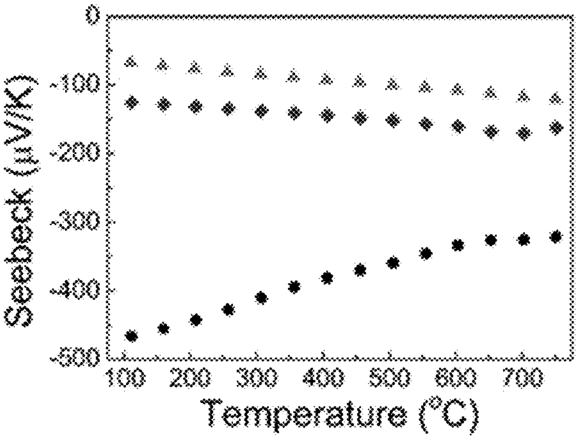
Figure 10F:
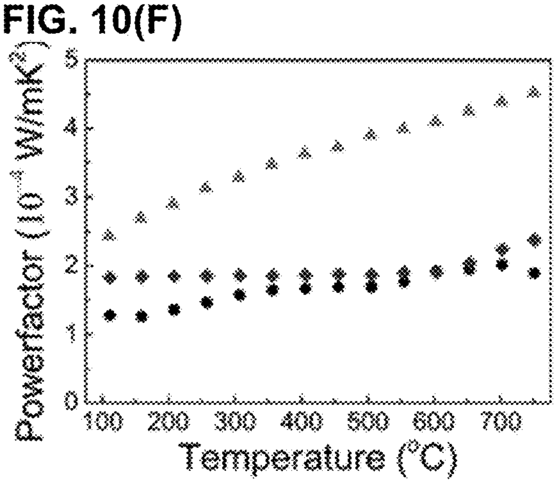

FIGS. 9(A-C) show plots of the temperature dependent electrical conductivities, Seebeck coefficients and power factors of (1-y)ZnO-y$Ti_3C_2T_x$ nanocomposites cold sintered at 300° C. for h. ZnO ceramics prepared by conventional thermal sintering in air at 1550° C. for 2 h, 1400° C. for 10 h, and 950° C. for 3 h have a conductivity of 0.17 S/cm at 250° C., ~0.2 S/cm at ~120° C., and $10^{-3}$ to $10^{-2}$ S/cm at room temperature, respectively. When sintered in vacuum at 950° C. under a pressure of 100 MPa, ZnO showed a conductivity of 4-5 S/cm at 100° C. In the case of sintering in Ar atmosphere at 900° C. under a pressure of 75 MPa, the reported conductivity of ZnO reached 21.6 S/cm at room temperature, probably due to oxygen vacancies or ZnO interstitial. The present cold sintered pure ZnO showed an electrical conductivity of ~0.08 S/cm at 100° C. without further heat treatment, 2-5 S/cm with heat treatment, as shown in FIG. 9(A) and FIGS. 10(A-F), which is within the range reported in the literature. Without intending to be bound by the correctness of any particular theory or proposed explanation, the increase of electrical conductivity with heat treatment in inert atmosphere may have resulted from the change of the concentration of dominant native donors in ZnO.

With increasing the amount of 2D $Ti_3C_2T_x$, the electrical conductivity of the ZnO—$Ti_3C_2T_x$ nanocomposites improved by 1-2 orders of magnitude as plotted in FIG. 9(A) and FIGS. 10(A-F). $Ti_3C_2T_x$ is a metallic 2D material with a promising conductivity of $10^3$ to $10^4$ S/cm for both individual flakes and stacked films. In the case of ZnO—$Ti_3C_2T_x$ nanocomposites, most of $Ti_3C_2T_x$ nanosheets were distributed around the grain boundaries of ZnO, providing a fast path way for the electron transport. Therefore, the overall electrical conductivity was improved with the addition of $Ti_3C_2T_x$. The 95ZnO-5 $Ti_3C_2T_x$ nanocomposites cold sintered in air without further heat treatment showed a conductivity of 24 S/cm at 100° C. (ZnO: 0.08 S/cm) and 99ZnO-1 $Ti_3C_2T_x$ after heat treatment shows an increased conductivity of 544 S/cm at 100° C. (ZnO: 5 S/cm).

As shown by the temperature dependence, ZnO and 99.5ZnO-0.5 $Ti_3C_2T_x$ exhibited semiconducting behavior, whereas the ZnO—$Ti_3C_2T_x$ nanocomposites with larger amounts of $Ti_3C_2T_x$ exhibited a metallic behavior, perhaps resulting from the metallic properties of $Ti_3C_2T_x$ (FIGS. 9(A-C)). The Seebeck coefficients of all the ZnO—$Ti_3C_2T_x$ nanocomposites were negative, demonstrating that electrons were dominating charge carriers (n-type). Further, the absolute value of Seebeck coefficient of the ZnO—$Ti_3C_2T_x$ nanocomposites decreased slightly with increasing the amount of $Ti_3C_2T_x$. But the overall power-factor improved dramatically. The 99.5ZnO-0.5 $Ti_3C_2T_x$ nanocomposite, without further annealing, had a good conductivity, Seebeck coefficient and power-factor of 16 S/cm, −270 μV/K and $1.2\times10^{-4}$ W/mK$^2$ at 300° C., respectively. The 99ZnO-1$Ti_3C_2T_x$ nanocomposite annealed at 750° C. had a metallic conductivity of 312 S/cm, a Seebeck coefficient of −120 μV/K and a power-factor of about $4.5\times10^{-4}$ W/mK$^2$ at 750° C., which is promising for the thermoelectric applications, outperforming pure ZnO or MXenes studied to date.

Figure 11A:
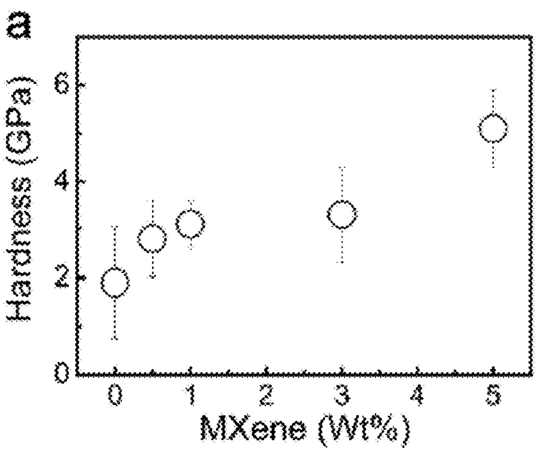
FIG. 11(A) shows hardness.
Figure 11B:
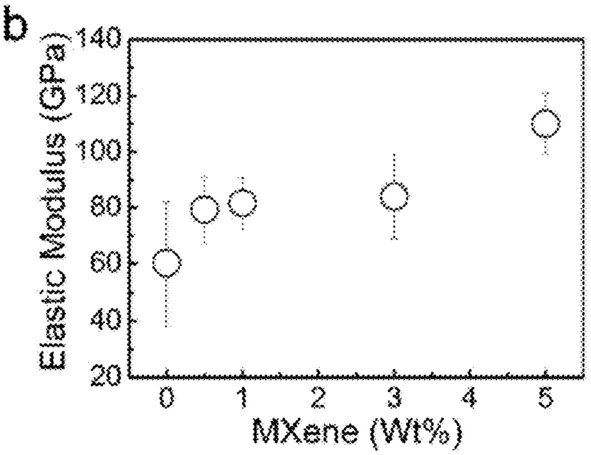
FIG. 11(B) shows elastic modulus.

FIGS. 11(A-B) present the room temperature mechanical properties of ZnO—$Ti_3C_2T_x$ nanocomposites cold sintered at 300° C. for 1 h. Polycrystalline ZnO ceramic prepared by conventional thermal sintering at 1300° C. have previously shown a hardness of 1.5-1.83 GPa. Microwave sintering and hot pressing of ZnO have produced hardness values of 0.49-1.72 and 2 GPa, respectively. With hot pressing in vacuum at 1200° C., ZnO ceramic (7 wt % impurity, $ZnAl_2O_4$) have shown higher hardness values of ~3.4 GPa. The hardness of ZnO ceramic fabricated by CSP at 300° C. fell within the range of other ZnO ceramics, but the hardness of ZnO—$Ti_3C_2T_x$ nanocomposites were dramatically and unexpectedly higher, increasing with increasing amounts of $Ti_3C_2T_x$ (FIG. 11(A)). The hardness was increased by 40-50% with 0.5 wt % $Ti_3C_2T_x$, and more than doubled with 5 wt % of $Ti_3C_2T_x$, likely resulting from the microstructure of ZnO—$Ti_3C_2T_x$ nanocomposites and the outstanding mechanical properties of $Ti_3C_2T_x$. The elastic modulus of cold sintered ZnO also fell in the range in the literature and increases with the addition of $Ti_3C_2T_x$, as shown in FIG. 11(B).

In summary, the present disclosure demonstrates the use of cold sintering processing to densify ZnO nanocomposites with $Ti_3C_2T_x$ and the surprising and unexpected results of such processing. The 2D $Ti_3C_2T_x$ were dispersed at the grain boundaries of ZnO and surprisingly minimized the coarsening of ZnO under the CSP conditions. With the addition of up to 5 wt % $Ti_3C_2T_x$, the electrical conductivity was increased by 1-2 orders of magnitude. The overall power-factor improved dramatically. The Seebeck coefficients of all the ZnO—$Ti_3C_2T_x$ nanocomposites are negative, indicating n-type charge carrier. The 99ZnO-1$Ti_3C_2T_x$ nanocomposite had a metallic conductivity of 312 S/cm, a Seebeck coefficient of −120 μV/K and a power-factor of ~$4.5\times10^{-4}$ W/mK$_2$ at 750° C. The hardness and elastic modulus of ZnO—$Ti_3C_2T_x$ nanocomposites were also dramatically and unexpectedly enhanced, including increases of 40-50% with only 0.5 wt % $Ti_3C_2T_x$, and even higher with higher loadings.

The following references provide useful support for the concepts described herein and are incorporated by reference herein for that purpose.

[1] A. Gupta, T. Sakthivel, S. Seal, *Prog. Mater. Sci.* 2015, 73, 44.
[2] S. Komarneni, *J. Mater. Chem.* 1992, 2, 1219.
[3] R. Mas-Balleste, C. Gomez-Navarro, J. Gomez-Herrero, F. Zamora, *Nanoscale* 2011, 3, 20.
[4] J. N. Coleman, U. Khan, W. J. Blau, Y. K. Gun'ko, *Carbon* 2006, 44, 1624.
[5] Q. Zhang, J. Q. Huang, W. Z. Qian, Y. Y. Zhang, F. Wei, *Small* 2013, 9, 1237.
[6] F. A. Khalid, O. Beffort, U. E. Klotz, B. A. Keller, P. Gasser, *Diam. Relat. Mater.* 2004, 13, 393.
[7] B. S. Xu, *New Carbon Mater.* 2008, 23, 289.
[8] D. Mattia, M. P. Rossi, B. M. Kim, G. Korneva, H. H. Bau, Y. Gogotsi, *J. Phys. Chem. B* 2006, 110, 9850.
[9] V. N. Mochalin, O. Shenderova, D. Ho, Y. Gogotsi, *Nat. Nanotechnol.* 2012, 7, 11.
[10] G. N. Yushin, S. Osswald, P. VI, G. P. Bogatyreva, Y. Gogotsi, *Diam. Relat. Mater.* 2005, 14, 1721.
[11] J. Guo, H. Z. Guo, A. L. Baker, M. T. Lanagan, E. R. Kupp, G. L. Messing, C. A. Randall, *Angew. Chem. -Int. Edit.* 2016, 55, 11457.
[12] J. Guo, S. S. Berbano, H. Z. Guo, A. L. Baker, M. T. Lanagan, C. A. Randall, *Adv. Funct. Mater.* 2016, 26, 7115.
[13] H. Z. Guo, A. Baker, J. Guo, C. A. Randall, *J. Am. Ceram. Soc.* 2016, 99, 3489.

[14] S. Funahashi, J. Guo, H. Z. Guo, K. Wang, A. L. Baker, K. Shiratsuyu, C. A. Randall, *J. Am. Ceram. Soc.* 2017, 100, 546.
[15] J. Guo, A. L. Baker, H. Z. Guo, M. Lanagan, C. A. Randall, *J. Am. Ceram. Soc.* 2017, 100, 669.
[16] M. N. Rahaman, *Sintering of Ceramics*, CRC Press, Boca Raton, FL, USA 2008.
[17] X. Zhao, J. Guo, K. Wang, T. Herisson De Beauvoir, B. Li, C. A. Randall, *Adv. Eng. Mater.* 2018, accepted, DOI: 10.1002/adem.201700902.
[18] J.-H. Seo, K. Verlinde, J. Guo, D. Sohrabi Baba Heidary, R. Rajagopalan, T. E. Mallouk, C. A. Randall, *Scr. Mater.* 2018, 146, 267.
[19] M. Naguib, M. Kurtoglu, V. Presser, J. Lu, J. J. Niu, M. Heon, L. Hultman, Y. Gogotsi, M. W. Barsoum, *Adv. Mater.* 2011, 23, 4248.
[20] B. Anasori, M. R. Lukatskaya, Y. Gogotsi, *Nat. Rev. Mater.* 2017, 2, 16098.
[21] A. Lipatov, M. Alhabeb, M. R. Lukatskaya, A. Boson, Y. Gogotsi, A. Sinitskii, *Adv. Electron. Mater.* 2016, 2, 1600255.
[22] C. F. Zhang, B. Anasori, A. Seral-Ascaso, S. H. Park, N. McEvoy, A. Shmeliov, G. S. Duesberg, J. N. Coleman, Y. Gogotsi, V. Nicolosi, *Adv. Mater.* 2017, 29, 1702678.
[23] Z. Ling, C. E. Ren, M. Q. Zhao, J. Yang, J. M. Giammarco, J. S. Qiu, M. W. Barsoum, Y. Gogotsi, *P. Natl. Acad. Sci. USA* 2014, 111, 16676.
[24] H. Zhang, L. B. Wang, Q. Chen, P. Li, A. G. Zhou, X. X. Cao, Q. K. Hu, Mater. *Design* 2016, 92, 682.
[25] F. Shahzad, M. Alhabeb, C. B. Hatter, B. Anasori, S. M. Hong, C. M. Koo, Y. Gogotsi, *Science* 2016, 353, 1137.
[26] C. F. J. Zhang, S. Pinilla, N. McEyoy, C. P. Cullen, B. Anasori, E. Long, S. H. Park, A. Seral-Ascaso, A. Shmeliov, D. Krishnan, C. Morant, X. H. Liu, G. S. Duesberg, Y. Gogotsi, V. Nicolosi, *Chem. Mat.* 2017, 29, 4848.
[27] Z. Y. Li, L. B. Wang, D. D. Sun, Y. D. Zhang, B. Z. Liu, Q. K. Hu, A. G. Zhou, *Mater. Sci. Eng. B-Adv.* 2015, 191, 33.
[28] D. C. Look, *Mat. Sci. Eng. B-Solid* 2001, 80, 383. L. Vayssieres, *Adv. Mater.* 2003, 15, 464.
[30] U. Ozgur, Y. I. Alivov, C. Liu, A. Teke, M. A. Reshchikov, S. Dogan, V. Avrutin, S. J. Cho, H. Morkoc, *J. Appl. Phys.* 2005, 98, 041301.
[31] H. Ohta, W. S. Seo, K. Koumoto, *J. Am. Ceram. Soc.* 1996, 79, 2193.
[32] T. Tsubota, M. Ohtaki, K. Eguchi, H. Arai, *J. Mater. Chem.* 1997, 7, 85.
[33] W. H. Nam, Y. S. Lim, S. M. Choi, W. S. Seo, J. Y. Lee, *J. Mater. Chem.* 2012, 22, 14633.
[34] D. S. Chen, Y. Zhao, Y. N. Chen, B. A. Wang, H. Y. Chen, J. Zhou, Z. Q. Liang, *ACS Appl. Mater. Inter.* 2015, 7, 3224.
[35] P. Jood, R. J. Mehta, Y. L. Zhang, G. Peleckis, X. L. Wang, R. W. Siegel, T. Borca-Tasciuc, S. X. Dou, G. Ramanath, *Nano Lett.* 2011, 11, 4337.
[36] K. F. Cai, E. Muller, C. Drasar, A. Mrotzek, *Mat. Sci. Eng. B-Solid* 2003, 104, 45.
[37] D. C. Look, D. C. Reynolds, J. R. Sizelove, R. L. Jones, C. W. Litton, G. Cantwell, W. C. Harsch, *Solid State Commun.* 1998, 105, 399.
[38] D. C. Look, J. W. Hemsky, J. R. Sizelove, *Phys. Rev. Lett.* 1999, 82, 2552.
[39] C. G. Van de Walle, *Phys. Rev. Lett.* 2000, 85, 1012.
[40] B. Zhu, D. Li, T. Zhang, Y. Luo, R. Donelson, T. Zhang, Y. Zheng, C. Du, L. Wei, H. Hng, *Ceram. Int.* 2018, 44, 6461.
[41] H. Kim, B. Anasori, Y. Gogotsi, H. N. Alshareef, *Chem. Mat.* 2017, 29, 6472.
[42] T. K. Roy, *Mater. Sci. Eng. A-Struct. Mater. Prop. Microstruct. Process.* 2015, 640, 267.
[43] A. K. Mukhopadhyay, M. R. Chaudhuri, A. Seal, S. K. Dalui, M. Banerjee, K. K. Phani, *Bull. Mat. Sci.* 2001, 24, 125.
[44] D. B. Marshall, T. Noma, A. G. Evans, *J. Am. Ceram. Soc.* 1982, 65, C175.
[45] H. Ruf, A. G. Evans, *J. Am. Ceram. Soc.* 1983, 66, 328.
[46] V. N. Borysiuk, V. N. Mochalin, Y. Gogotsi, *Comp. Mater. Sci.* 2018, 143, 418.
[47] S. O. Kucheyev, J. E. Bradby, J. S. Williams, C. Jagadish, M. V. Swain, *Appl. Phys. Lett.* 2002, 80, 956.
[48] S. Basu, M. W. Barsoum, *J. Mater. Res.* 2007, 22, 2470.
[49] M. Alhabeb, K. Maleski, B. Anasori, P. Lelyukh, L. Clark, S. Sin, Y. Gogotsi, *Chem. Mat.* 2017, 29, 7633.

All references cited within this specification, including the Attachments, are incorporated by reference in their entireties for all purposes, or at least for their teachings in the context of their recitation.

What is claimed:

1. A nanocomposite, comprising:

a co-sintered composition of a (i) MXene composition and (ii) an inorganic oxide, oxycarbide, oxynitride, or oxycarbonitride, the MXene composition being distributed substantially homogeneously throughout the nanocomposite, the MXene composition being present in an amount of from about 5% to about 25% by weight relative to the weight of the entire nanocomposite, and wherein the MXene composition has at least one layer having first and second surfaces, each layer described by a formula $M'_2M''_nX_{n+1}$ and comprising:

a substantially two-dimensional array of crystal cells, each crystal cell having an empirical formula of $M'_2M''_nX_{n+1}$, such that each X is positioned within an octahedral array of M' and M", and where $M''_n$ are present as individual two-dimensional array of atoms intercalated (sandwiched) between a pair of two-dimensional arrays of M' atoms, wherein M' and M" are different Group IIIB, IVB, VB, or VIB metals (especially where M' and M" are Ti, V, Nb, Ta, Cr, Mo, or a combination thereof), wherein each X is C, N, or a combination thereof; and n=1 or 2.

2. The nanocomposite of claim 1, wherein the inorganic oxide comprises an inorganic binary, ternary, or quaternary oxide.

3. The nanocomposite of claim 1, wherein the oxide, oxycarbide, oxynitride, or oxycarbonitride comprises one or more alkali metals, one or more oxides of alkali metals, an alkaline earth metal, a transition metal, a lanthanide metal, an actinide metal, and a metalloid.

4. The nanocomposite of claim 1, wherein the inorganic oxide, oxycarbide, oxynitride, or oxycarbonitride comprises any one or more of Ti, Zr, Hf, V, Nb, Ta, Cr, Mo, W, Mn, Re, Fe, Ru, Os, Co, Rh, Ir, Ni, Pd, Pt, Cu, Ag, Au, Zn, Cd, Al, Ga, In, Ge, Sn, Pb, and Bi.

5. The nanocomposite of claim 1, comprising one or more oxides of In, Ti, Sn, Zn, or Zr.

6. The nanocomposite of claim 1, comprising one or more oxides of Co, M n, Nb, Pb, Ta, Ti, W, Zn, or Zr.

7. The nanocomposite of claim 1, wherein the inorganic oxide, oxycarbide, oxynitride, or oxycarbonitride is or comprises a ferrite, a nickelate, a niobate, a ruthenate, a tantalate, a titanate, a tungstate, a vanadate, a zirconate, or a combination or mixture thereof.

8. The nanocomposite of claim 1, comprising ZnO.

9. The nanocomposite of claim 1, wherein the MXene composition comprises at least one layer having first and second surfaces, each layer described by a formula $M_{n+1}X_n$ and comprising:

a substantially two-dimensional array of crystal cells, each crystal cell having an empirical formula of $M_{n+1}X_n$, such that each X is positioned within an octahedral array of M, wherein M is at least one Group IIIB, IVB, VB, or VIB metal, wherein each X is C, N, or a combination thereof;

n=1, 2, or 3.

10. The nanocomposite of claim 9, wherein the empirical formula of the $M_{n+1}X_n$ MXene composition comprises $Sc_2C$, $Ti_2C$, $V_2C$, $Cr_2C$, $Cr_2N$, $Zr_2C$, $Nb_2C$, $Hf_2C$, $Ti_3C_2$, $V_3C_2$, $Ta_3C_2$, $Ti_4C_3$, $V_4C_3$, $Ta_4C_3$, $Sc_2N$, $Ti_2N$, $V_2N$, $Cr_2N$, $Cr_2N$, $Zr_2N$, $Nb_2N$, $Hf_2C$, $Ti_3N_2$, $V_3C_2$, $Ta_3C_2$, $Ti_4N_3$, $V_4C_3$, $Ta_4N_3$ or a combination or mixture thereof, preferably $Ti_3C_2$ or $Ti_2C$.

11. The nanocomposite of claim 10, wherein the MXene composition comprises a substantially two-dimensional array of crystal cells having an empirical formula of $Ti_3C_2$.

12. The nanocomposite of claim 1, wherein the empirical formula of the $M'_2M''_nX_{n+1}$, MXene composition comprises $Mo_2TiC_2$, $Mo_2VC_2$, $Mo_2TaC_2$, $Mo_2NbC_2$, $Mo_2Ti_2C_3$, $Cr_2TiC_2$, $Cr_2VC_2$, $Cr_2TaC_2$, $Cr_2NbC_2$, $Ti_2NbC_2$, $Ti_2TaC_2$, $V_2TaC_2$, or $V_2TiC_2$, preferably $Mo_2TiC_2$, $Mo_2VC_2$, $Mo_2TaC_2$, or $Mo_2NbC_2$, or their nitride or carbonitride analogs or $Mo_2Ti_2C_3$, $Mo_2$ $V_2C_3$, $Mo_2Nb_2C_3$, $Mo_2Ta_2C_3$, $Cr_2Ti_2C_3$, $Cr_2V_2C_3$, $Cr_2Nb_2C_3$, $CnTa_2C_3$, $Nb_2Ta_2C_3$, $Ti_2Nb_2C_3$, $Ti_2Ta_2C_3$, $V_2Ta_2C_3$, $V_2Nb_2C_3$, or $V_2Ti_2C_3$, preferably $Mo_2Ti_2C_3$, $Mo_2$ $V_2C_3$, $Mo_2Nb_2C_3$, $Mo_2Ta_2C_3$, $Ti_2Nb_2C_3$, $Ti_2Ta_2C_3$, or $V_2Ta_2C_3$ or their nitride or carbonitride analogs.

13. The nanocomposite of claim 1, wherein the inorganic oxide, oxycarbide, oxynitride, or oxycarbonitride is present as grains within the nanocomposite, the grains having dimensions in a range of from 100 nm to 200 nm, 200 nm to 300 nm, 300 nm to 400 nm, 400 nm to 500 nm, 500 nm to 600 nm, 600 nm to 700 nm, 700 nm to 800 nm, 800 nm to 900 nm, or any combination of two or more of the foregoing ranges.

14. The nanocomposite of claim 1, wherein the nanocomposite exhibits a density greater than 90% of the theoretical density of the nanocomposite.

15. The nanocomposite of claim 1, wherein the MXene composition is distributed along grain boundaries of the sintered nanocomposite.

16. The nanocomposite of claim 1, wherein the MXene composition is distributed homogeneously along grain boundaries of the sintered nanocomposite.

* * * * *